US006924088B2

(12) United States Patent
Mui et al.

(10) Patent No.: US 6,924,088 B2
(45) Date of Patent: Aug. 2, 2005

(54) METHOD AND SYSTEM FOR REALTIME CD MICROLOADING CONTROL

(75) Inventors: David S. L. Mui, Fremont, CA (US); Wei Liu, San Jose, CA (US); Shashank C. Deshmukh, San Jose, CA (US); Hiroki Sasano, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 46 days.

(21) Appl. No.: 10/464,479

(22) Filed: Jun. 18, 2003

(65) Prior Publication Data

US 2004/0038139 A1 Feb. 26, 2004

Related U.S. Application Data

(63) Continuation-in-part of application No. 10/238,453, filed on Sep. 9, 2002, now Pat. No. 6,858,361.
(60) Provisional application No. 60/390,480, filed on Jun. 20, 2002.

(51) Int. Cl.$^7$ .......................... G01B 11/02; H01L 21/66
(52) U.S. Cl. .................... 430/313; 430/30; 156/345.24; 356/635; 356/636; 118/696; 438/7; 438/16
(58) Field of Search .............. 430/30, 313; 156/345.24; 356/635, 636; 118/696; 438/7, 16

(56) References Cited

U.S. PATENT DOCUMENTS

| | | | |
|---|---|---|---|
| 4,447,731 A | 5/1984 | Kuni et al. |
| 4,911,103 A | 3/1990 | Davis et al. |
| 5,109,430 A | 4/1992 | Nishihara et al. |
| 5,171,393 A | 12/1992 | Moffat |
| 5,452,521 A | 9/1995 | Niewmierzycki |
| 5,653,894 A | 8/1997 | Ibbotson et al. |
| 5,913,102 A | 6/1999 | Yang |
| 5,926,690 A | 7/1999 | Toprac et al. |
| 5,944,940 A | 8/1999 | Toshima |
| 5,963,329 A | 10/1999 | Conrad et al. |
| 5,980,766 A | 11/1999 | Flamm et al. |
| 6,001,699 A | 12/1999 | Nguyen et al. |
| 6,004,706 A | 12/1999 | Ausschnitt et al. |
| 6,007,675 A | 12/1999 | Toshima |
| 6,027,842 A | 2/2000 | Ausschnitt et al. |
| 6,033,814 A | 3/2000 | Burdorf et al. |
| 6,054,710 A | 4/2000 | Bruggeman |
| 6,124,212 A | 9/2000 | Fan et al. |
| 6,143,081 A | 11/2000 | Shinriki et al. |
| 6,148,239 A | 11/2000 | Funk et al. |
| 6,175,417 B1 | 1/2001 | Do et al. |
| 6,178,239 B1 | 1/2001 | Kishinsky et al. |
| 6,225,639 B1 | 5/2001 | Adams et al. |
| 6,245,581 B1 | 6/2001 | Bonser et al. |
| 6,388,253 B1 | 5/2002 | Su |
| 6,424,417 B1 | 7/2002 | Cohen et al. |
| 2002/0155629 A1 | 10/2002 | Fairbairn et al. |

FOREIGN PATENT DOCUMENTS

| | | |
|---|---|---|
| EP | 0727715 A1 | 8/1996 |
| EP | 1 079 428 A2 | 2/2001 |
| EP | 1 083 424 A2 | 3/2001 |
| JP | 61290312 | 12/1986 |
| WO | WO 01/09934 A1 | 2/2001 |
| WO | WO 01/84382 A1 | 11/2001 |
| WO | WO 02/09170 A2 | 1/2002 |
| WO | WO 02/37186 A1 | 5/2002 |

OTHER PUBLICATIONS

US 6,150,664, 11/2000, Su (withdrawn)

European Search Report dated Mar. 30, 2001 in parent case.

Davidson et al., "An Inverse Scattering Approach to SEM Line Width Measurements", Technical Program and Abstract Digest, SPIE's 24th International Symposium on Microlithography, Mar. 1999, Santa Clara, CA.

Anthony J. Toprac, "AMD's Advanced Process Control of Poly–gate Critical Dimension", SPIE Conference on Process, Equipment and Materials Control in Integrated Circuit Manufacturing, Sep. 1999, Santa Clara, CA, SPIE vol. 3882.

Lee, M.E., et al., "Analysis of Reflectometry and Ellipsometry Data from Patterned Structures", *Characterization and Metrology for ULSI Technology: 1998 International Conference*, ed. D.G. Seiler, et al., 1998, pp. 331–335.

McIntosh, J.M., et al., "Approach to CD SEM Metrology Utilizing the Full Waveform Signal", Proceedings of the SPIE, vol. 3332, pp. 51–60, Feb. 23, 1998.

Ausschnit, Christopher P., et al., "Seeing the Forest for the Trees: A New Approach to CD Control," Ed. Bhanwar Singh, *Proceedings of the SPIE*, vol. 3332, pp. 212–220, Feb. 23–25, 1998.

(Continued)

*Primary Examiner*—John A. McPherson
*Assistant Examiner*—Daborah Chacko-Davis
(74) *Attorney, Agent, or Firm*—McDermott, Will & Emery; Joseph Bach

(57) ABSTRACT

A method and apparatus for processing a semiconductor wafer is provided for reducing CD microloading variation. OCD metrology is used to inspect a wafer to determine pre-etch CD microloading, by measuring the CD of dense and isolated photoresist lines. Other parameters can also be measured or otherwise determined, such as sidewall profile, photoresist layer thickness, underlying layer thickness, photoresist pattern density, open area, etc. The inspection results are fed forward to the etcher to determine process parameters, such as resist trim time and/or etch conditions, thereby achieving the desired post-etch CD microloading. In certain embodiments, the CD and profile measurements, trim, etch processing and post-etch cleaning are performed at a single module in a controlled environment. All of the transfer and processing steps performed by the module are performed in a clean environment, thereby increasing yield by avoiding exposing the wafer to the atmosphere and possible contamination between steps.

59 Claims, 24 Drawing Sheets

OTHER PUBLICATIONS

Moharam, M.G., et al., "Stable Implementation of the Rigorous Coupled–Wave Analysis for Surface–Relief Gratings: Enhanced Transmittance Matrix Approach," Journal of the Optical Society of America, vol. 12, No. 5, pp. 1077–1086, May 1995.

Chateau, Nicolas, "Algorithm for the Rigorous Coupled–Wave Analysis of Grating Diffusion," Journal of the Optical Society of America, vol. 11, No. 4, pp. 1321–1331, Apr. 1994.

Raymond, Christopher J., "Angle–Resolved Scatterometry for Semiconductor Manufacturing", Microlithography World, Winter 2000, pp. 18–23.

|  | | DENSE | ISO | μLOADING | IDEAL |
|---|---|---|---|---|---|
| WFR 1 | PRE ETCH | 100 | 90 | 10 | YES |
| WFR 1 | POST ETCH | 80 | 70 | 10 | YES |
| WFR 2 | PRE ETCH | 95 | 80 | 15 | NO |
| WFR 2 | POST ETCH | 80 | 65 | 15 | NO |
| WFR 3 | PRE ETCH | 95 | 80 | 15 | NO |
| WFR 3 | POST ETCH | 80 | 70 | 10 | YES |

FIG. 8

METHOD AND SYSTEM FOR REALTIME CD MICROLOADING CONTROL

RELATED APPLICATIONS

This application is a continuation-in-part of U.S. application Ser. No. 10/238,453, filed Sep. 9, 2002, now U.S. Pat. No. 6,858,361. This application is based on and claims priority from U.S. Provisional Application Ser. No. 60/390,480, filed Jun. 20, 2002.

FIELD OF THE INVENTION

The present invention relates to a method and apparatus for monitoring and controlling processing carried out on a semiconductor substrate, and more particularly for controlling critical dimensions (CDs) of features formed on the semiconductor substrate through feedback and feed-forward of information gathered during in-process inspection of the features. The invention has particular applicability for in-line inspection of semiconductor wafers during manufacture of high-density semiconductor devices with submicron design features.

BACKGROUND ART

Current demands for high density and performance associated with ultra large scale integration require submicron features, increased transistor and circuit speeds and improved reliability. Such demands require formation of device features with high precision and uniformity, which in turn necessitates careful process monitoring, including frequent and detailed inspections of the devices while they are still in the form of semiconductor wafers.

One important process requiring careful inspection is photolithography, wherein masks are used to transfer circuitry patterns to semiconductor wafers. Typically, a series of such masks are employed in a preset sequence. Each photolithographic mask includes an intricate set of geometric patterns corresponding to the circuit components to be integrated onto the wafer. Each mask in the series is used to transfer its corresponding pattern onto a photosensitive layer (i.e., a photoresist layer) which has been previously coated on a layer, such as a polysilicon or metal layer, formed on the silicon wafer. The transfer of the mask pattern onto the photoresist layer is conventionally performed by an optical exposure tool such as a scanner or a stepper, which directs light or other radiation through the mask to expose the photoresist. The photoresist is thereafter developed to form a photoresist mask, and the underlying polysilicon or metal layer is selectively etched in accordance with the mask to form features such as lines or gates.

Fabrication of the mask follows a set of predetermined design rules set by processing and design limitations. These design rules define the space tolerance between devices and interconnecting lines and the width of the lines themselves, to ensure that the devices or lines do not overlap or interact with one another in undesirable ways. The design rule limitation is referred to as the critical dimension ("CD"), defined as the smallest width of a line or the smallest space between two lines permitted in the fabrication of the device. The CD for most ultra large scale integration applications is on the order of a fraction of a micron.

A related process where CD is crucial is known as "resist trim". As those skilled in the art will appreciate, photolithography employing light to expose sub-micron features on a photoresist layer is very costly and complicated. Moreover, as desired feature line widths become smaller, the limits of the photolithographic process are frequently exceeded. For example, 50–70 nanometer line widths are becoming commonplace, but photolithographic processes are typically capable of producing line widths no smaller than 100–120 nanometers. Thus, techniques have been developed to use photolithograpy equipment to expose features that are larger than desired, then follow this exposure with a process called a resist trim to "shrink" the exposed features to their final size. Photoresist trim extends lithography capabilities by using a plasma etch step that can physically reduce the printed photoresist CD by up to 80 percent. Specifically, after the oversized features are exposed and the photoresist developed, the wafer is brought to an etch chamber, and a specifically designed "resist etch step" is carried out, typically an isotropic etch step that shrinks the size of the developed resist feature. The actual feature (e.g., a polysilicon gate or metal line) is thereafter etched, typically using a different etch recipe in the same or in a different etch chamber.

As design rules shrink and process windows (i.e., the margins for error in processing) become smaller, inspection and measurement of surface features' CD, as well as their cross-sectional shape ("profile") are becoming increasingly important. Deviations of a feature's CD and profile from design dimensions may adversely affect the performance of the finished semiconductor device. Furthermore, the measurement of a feature's CD and profile may indicate processing problems, such as stepper defocusing or photoresist loss due to overexposure.

Another issue of importance in wafer processing using photoresist masks is that of microloading, which is the difference in CD between isolated lines and dense lines of the mask. The CD of dense lines (i.e., lines that are close to each other) tends to be slightly larger (e.g., about 10 microns larger) than that of isolated lines, due to the nature of the photolithographic process. The goal is to maintain a desired microloading during photoresist trim and underlying layer etch processing, so CD is not added or subtracted from any line. However, microloading disadvantageously varies from wafer to wafer, and during the trim and etch steps. Fixed trim and etch recipes maintain this wafer to wafer CD microloading variation. As design rules shrink and process windows become smaller, inspection and measurement of microloading variation is becoming increasingly important, since deviation from desired microloading may adversely affect the performance of the finished semiconductor device.

One method for monitoring and correcting CD variations is performed by selecting one or more test wafers from a lot of wafers whose photoresist has been exposed and developed to create larger-than-desired features, and measuring a representative photoresist feature CD from the test wafers, as with a critical dimension scanning electron microscope (CD-SEM). The wafers are then processed through a photoresist etch step and a gate etch step, and the CD of the etched feature is measured. The results of the initial and final CD measurements are then used to adjust the etch recipe for the remaining wafers in the lot to drive their CDs to target values. According to conventional CD monitoring techniques, measuring CDs of sample wafers (i.e., initially measuring photoresist features formed on the wafers and then measuring gates) is done off-line at a SEM, and the CD of a particular feature on a wafer is not used to decide what etch recipe is used for processing that wafer. Furthermore, feature profile is not measured or taken into account when adjusting the etch recipe according to conventional techniques. For further information regarding prior art techniques, the reader is directed to, for example, U.S. Pat. No. 5,926,690 to Toprac et al.

As Advanced Process Control (APC) is gaining widespread adoption with semiconductor manufacturers, semiconductor equipment manufacturers are coming under increasing pressure to provide integrated process control solutions. With feature sizes shrinking below 130 nm, the need for very tight process tolerances and the need for productivity improvement from the billion-plus dollar factories are driving the need for APC.

There exists a need for a simple, cost-effective methodology for fast and meaningful identification and correction of CD and profile variation without significantly reducing production throughput or yield. There also exists a need for a robust and efficient apparatus and methodology for accurately carrying out resist trim and etch operations to prevent excessive microloading variations.

SUMMARY OF THE INVENTION

An advantage of the present invention is the ability to reduce microloading variations in features formed on semiconductor wafers without reducing production throughput or yield, by utilizing information gathered during in-process inspection of the wafers.

According to the present invention, the foregoing and other advantages are achieved in part by a method of processing a semiconductor wafer, comprising measuring a CD of an isolated pattern of a patterned layer formed on an underlying layer on the wafer; measuring a CD of a dense pattern that is one of a plurality of patterns of the patterned layer disposed proximal to each other; selecting a first set of process parameter values for a first process to be performed on the wafer, based on the measurements of the isolated pattern CD and the dense pattern CD; and performing the first process on the wafer at a processing tool using the first set of process parameter values.

A further aspect of the present invention is an apparatus for processing a semiconductor wafer, comprising a measuring tool for measuring a CD of an isolated pattern on a patterned layer formed on an underlying layer on the wafer, and for measuring a CD of a dense pattern that is one of a plurality of patterns of the patterned layer disposed proximal to each other; a processing tool for performing a process on the wafer using a first set of process parameter values; and a processor configured to select the first set of process parameter values based on the measurements of the isolated pattern CD and the dense pattern CD.

Additional advantages of the present invention will become readily apparent to those skilled in this art from the following detailed description, wherein only illustrative embodiments of the present invention are shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIG. 8 is a table showing the results of utilizing an embodiment of the present invention.

DETAILED DESCRIPTION

Figure 1:
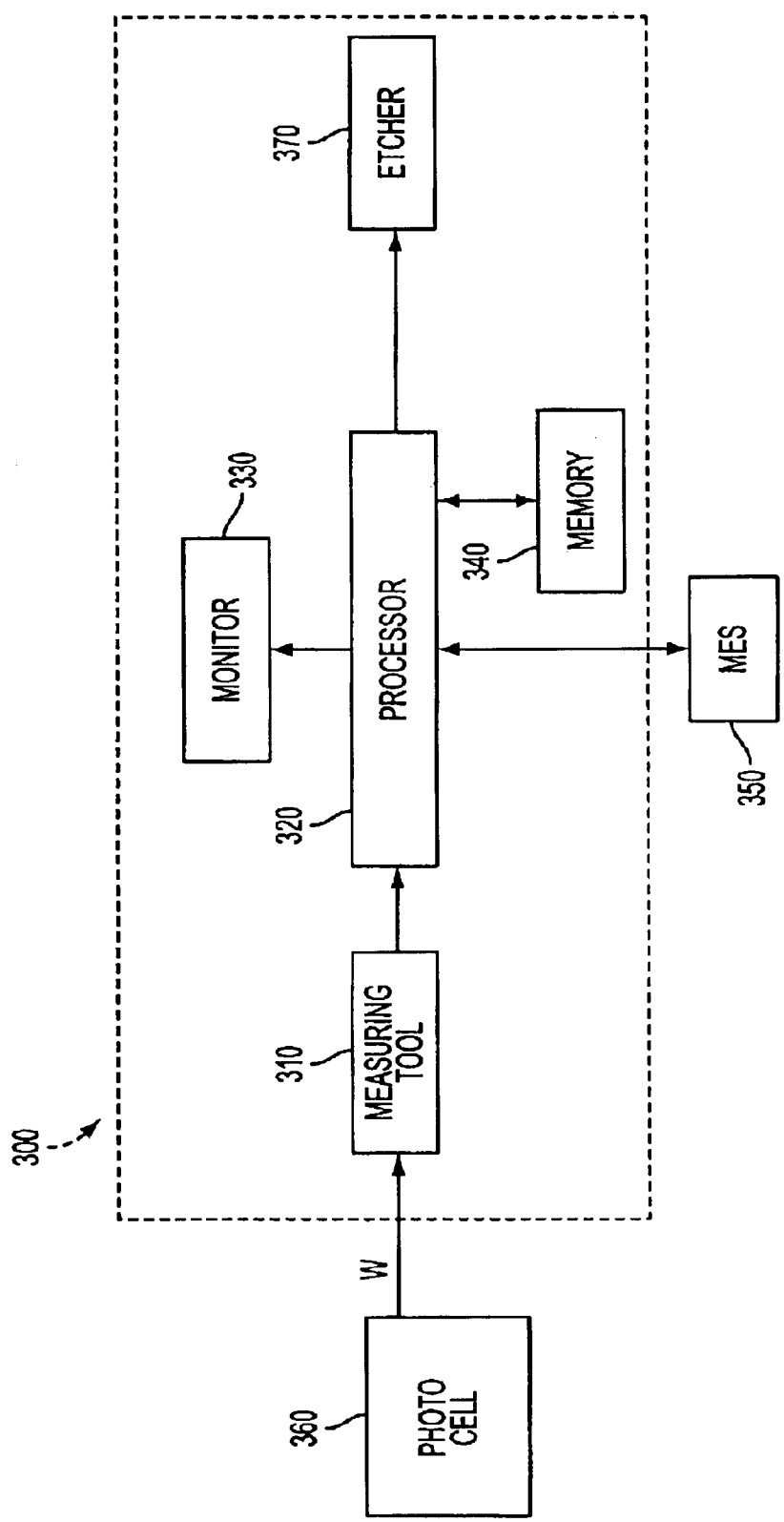
FIG. 1 is a block diagram of an apparatus according to an embodiment of the present invention.

The present invention inspects every wafer to determine pre-etch CD and profile, as by optical CD (OCD) metrology, a scanning electron microscope tool (CDSEM) or an atomic force microscope (AFM), then uses the inspection results to determine process parameters, such as resist trim time and/or etch parameters. In this way, the present invention enables accurate final CD and profile dimensions. The present invention addresses the problem of CD and microloading control by reducing CD variation by feeding forward information relating to photoresist mask CD and profile to adjust the next process the inspected wafer will undergo (e.g., the photoresist trim process and subsequent etch processes).

The present invention also inspects every wafer to determine pre-etch CD microloading, by measuring the CD of dense and isolated photoresist lines. Other parameters can also be measured or otherwise determined, such as sidewall profile, photoresist layer thickness, underlying layer thickness, photoresist pattern density, open area, etc. The inspection results are fed forward to the etcher to determine process parameters, such as resist trim time and/or etch conditions, thereby achieving the desired post-etch CD microloading. Thus, the present invention addresses the problem of wafer-to-wafer CD microloading variation, and the problem of microloading variation created during the photoresist trim and etch processes, by feeding forward information to determine trim and/or etch parameters based on pre-etch conditions and post-etch requirements.

In certain embodiments of the present invention, pre-etch CD and profile measurement, etching, cleaning, and post-etch CD measurement are performed entirely under controlled environmental conditions. By providing etching, cleaning and measurement tools on a mainframe and/or factory interface, a wafer can be etched, cleaned and inspected before being returned to a cassette, thereby reducing processing time and cost.

OCD metrology techniques as employed in certain embodiments of the present invention are APC enablers and utilize novel technology to the CD measurement world. For example, normal incidence spectroscopic OCD metrology systems provide detailed line profiles not possible with in-line non-destructive SEMs. The compact size and speed of OCD technology enables the measurement system of the present invention to be fully integrated into a process tool, such as Applied Materials' DPSII etch system. When combined with APC software, this provides a complete, feedforward solution for wafer-to-wafer closed loop control.

An example of a processing step that benefits from the complete feedforward solution of the present invention is etch processing that is sensitive to incoming photoresist (PR) dimensions. CD control is particularly critical for gate etch, in which the device speed is determined by the final gate CD. Here, the variation in incoming resist mask CD creates a proportional variation in the final etched CD. Measuring the incoming resist CD prior to etching enables the etch process to be tuned to compensate for the variations due to lithography.

According to the methodology of the present invention, an underlying layer, such as a conductive layer, is formed on a wafer, and a patterned layer, such as a photoresist mask, is formed on the underlying layer, as by a photolithography process at a "photo cell" (e.g., exposure at a stepper followed by photoresist development). A pattern on the mask is inspected using an integrated metrology unit, such as an optical inspection tool, to determine its CD and profile. Of course, a plurality of patterns, isolated and dense, are inspected by the optical inspection tool if CD microloading control is to be performed. The wafer is then transferred to a conventional etch chamber, where the photoresist CD and profile measurements are used by the processor to adjust the photoresist trim recipe (e.g., the trim time), also taking into account the implicit etch uniformity performance of the etcher and the nonlinearity of the trim curve.

The underlying layer is thereafter etched using the trimmed photoresist pattern as a mask. In certain embodiments of the present invention, the etch recipe as well as the trim recipe is chosen responsive to the photoresist CD and profile measurements. After etching, the wafer is optionally cleaned, as by an ash photoresist strip followed by a wet cleaning step, and transferred back to the integrated metrology unit, where the CD, profile and depth of features formed by the etch process are measured and compared to the desired dimensions. Such information can be fed back to the processor (e.g., to compensate for etch process drift or photo cell problems) by adjustment of the trim recipe when etching the next wafer.

By taking into account photoresist CD and profile variation when choosing a resist trim recipe, the present invention decouples post-etch CD from pre-etch CD and profile. By measuring the incoming resist CD and adjusting the trim time, the etch process can compensate for variations in lithography on successive wafers. With automatic compensation of incoming resist CD from the lithography step, a much tighter distribution of post-etch CD and microloading is achieved by the present invention, and the final CD and microloading uniformity become a realistic etch specification without impacting the productivity of the etch tool.

An exemplary embodiment of the present invention is implemented using an inspection tool in a processing line 300, as shown in FIG. 1, comprising a measuring tool 310, e.g., an optical inspection tool such as the Nano OCD 9000 available from Nanometrics of Milpitas, Calif., or an optical imager as disclosed in U.S. Pat. No. 5,963,329. Optical measuring tool 310 can utilize scatterometry or reflectometry techniques. The use of scatterometry for inspection tools is disclosed in Raymond, "Angle-resolved scatterometry for semiconductor manufacturing", *Microlithography World,* Winter 2000. The use of reflectometry for inspection is taught in Lee, "Analysis of Reflectometry and Ellipsometry Data from Patterned Structures", *Characterization and Metrology for ULSI Technology:* 1998 *International Conference,* The American Institute of Physics 1998. Measuring tool 310 can also include a conventional CDSEM, such as the VeraSEM® available from Applied Materials of Santa Clara, Calif., in addition to or instead of an optical inspection tool. Furthermore, measuring tool 310 can include a conventional AFM, such as described in U.S. Pat. No. 6,392,229.

Processing line 300 further comprises a processor 320, which performs the analysis disclosed herein electronically, and a monitor 330 for displaying results of the analyses of processor 320. Processor 320 can be in communication with a memory device 340, such as a semiconductor memory, and a computer software-implemented database system 350 known as a "manufacturing execution system" (MES) conventionally used for storage of process information. Processor 320 can also be in communication with previously-described photo cell 360 and etcher 370.

Figure 2:
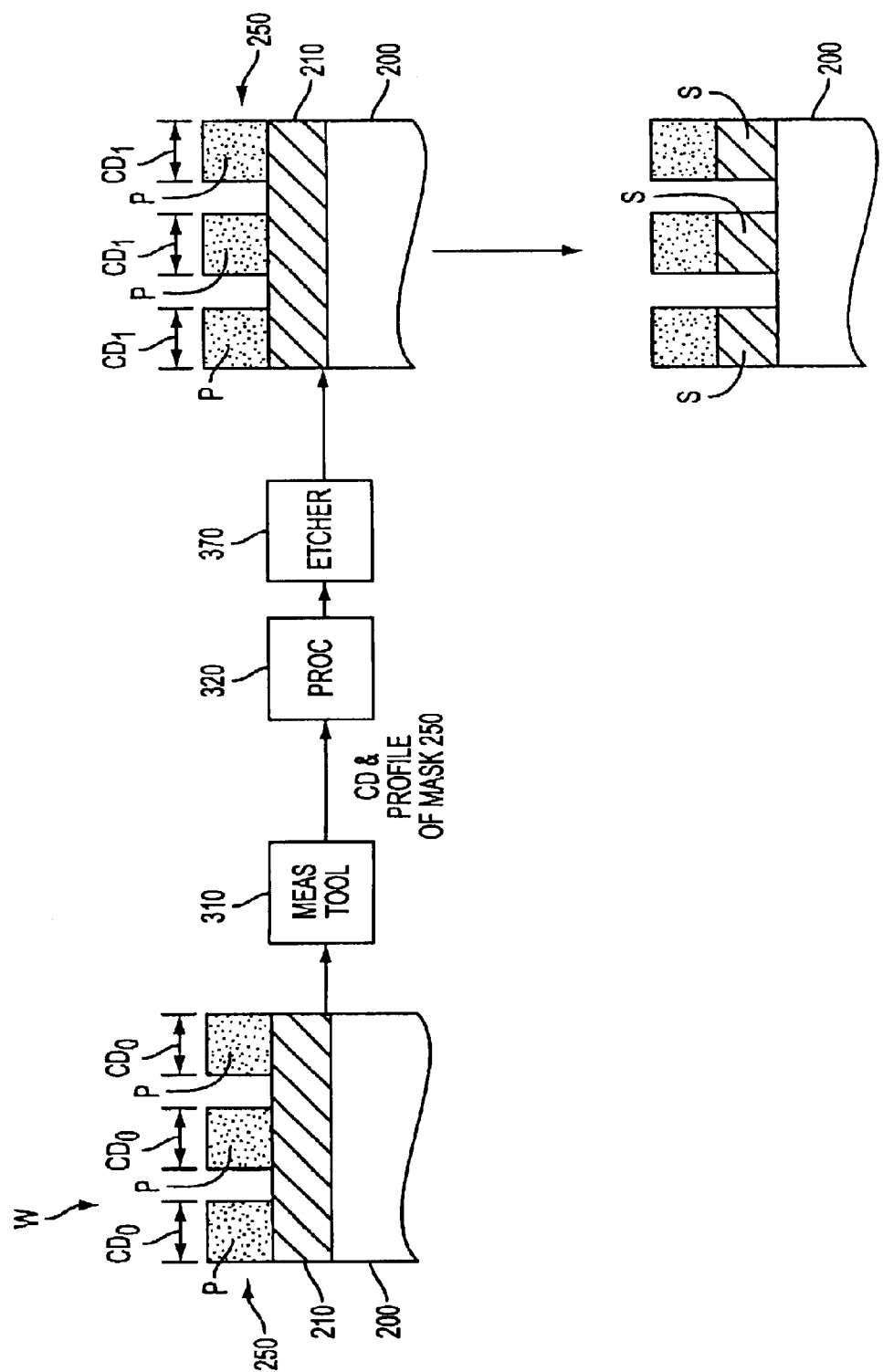
FIG. 2 is a process flow diagram for an embodiment of the present invention.
Figure 3:
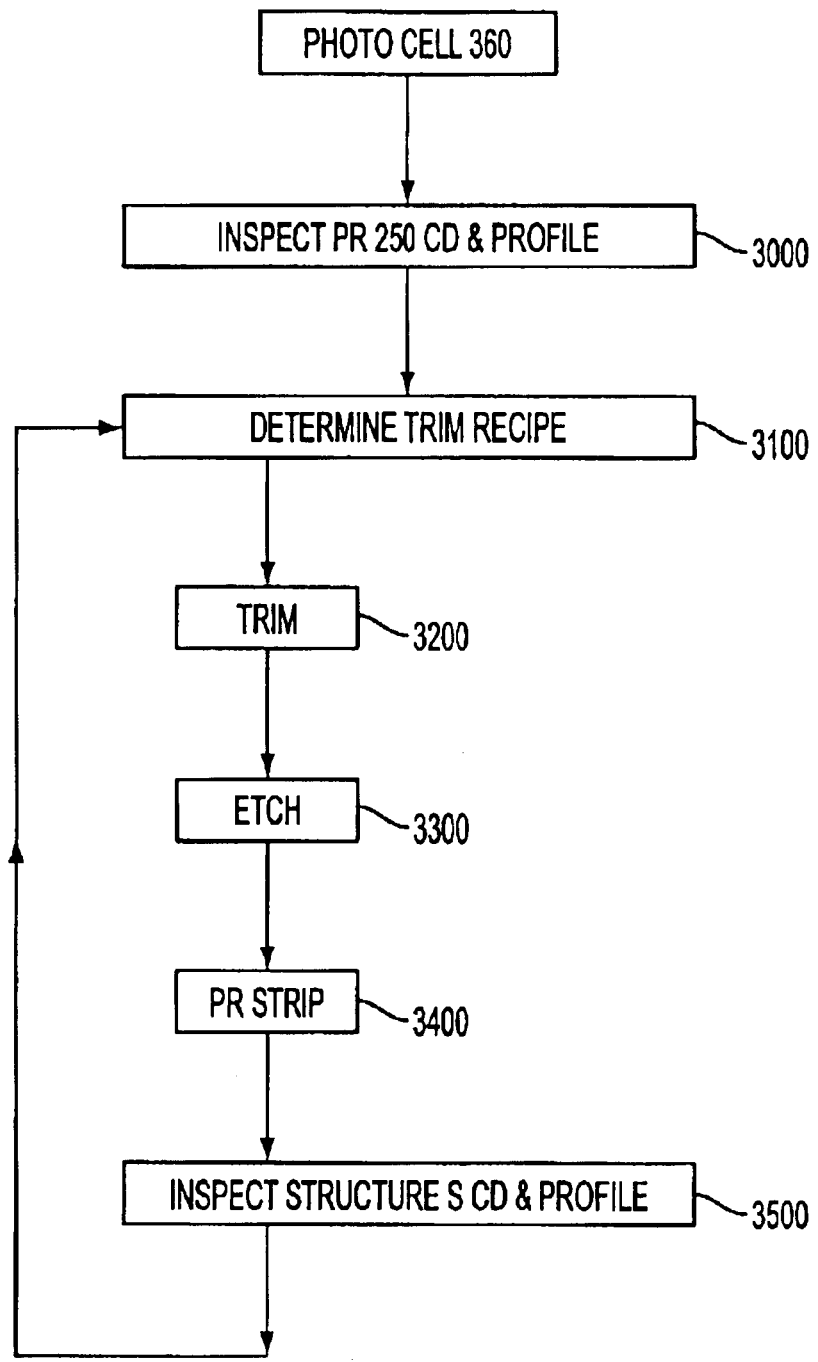
FIG. 3 is a flow chart illustrating sequential steps in a method according to an embodiment of the present invention.

An embodiment of the present invention will now be described in detail with reference to FIGS. 1–3. Referring now to the process flow diagram of FIG. 2, a wafer W to be processed by a dielectric etcher comprises a substrate 200 upon which is formed a conductive layer 210, such as polysilicon layer by deposition processing. A patterned photoresist layer 250 (i.e., a photoresist mask formed at photo cell 360) having patterns P is formed on conductive layer 210. An anti-reflective coating (ARC) layer (not shown) may be formed in a conventional manner between conductive layer 210 and photoresist layer 250 to aid the photolithographic process. Alternatively, a silicon nitride layer (not shown) can be formed on conductive layer 210 that is to be patterned to form a "hard mask" by etching using photoresist layer 250. Patterns P have an initial CD referred to as $CD_0$ in FIG. 2. As shown in the flow chart of FIG. 3, wafer W is brought from photo cell 360 to measuring tool 310 at step 3000, where the CD and profile of pattern P are optically measured. The CD and profile measurements are typically taken at several locations (i.e., patterns P) on wafer W. The number of measurements is ultimately limited by the etch process throughput requirements, and influenced by the process' maturity and past performance. Generally, the less mature the process, the greater the number of measurements should be taken. Typically, about five sample measurements are taken including, e.g., top, left, bottom, right and center of the wafer. The CDs and profiles of the measured features can then be averaged before being employed in subsequent steps of the present methodology.

Measuring tool 310 can directly measure CD and profile of certain patterns on photoresist layer 250, such as trenches and the like using conventional optical inspection techniques. For example, a rigorous coupled wave analysis (RCWA) can be performed, wherein a CD corresponding to a given waveform is derived by calculation, such as by a processor in the optical inspection tool. RCWA is discussed in Chateau, "Algorithm for the rigorous couple-wave analysis of grating diffraction", *Journal of the Optical Society of America,* Vol. 11, No. 4 (April 1994) and Moharam, "Stable implementation of the rigorous coupled-wave analysis for surface-relief gratings: enhanced transmittance matrix approach", *Journal of the Optical Society of America,* Vol. 12, No. 3 (May 1995).

The measured CD and profile are used by processor 320 at step 3100 to determine etch process parameters (i.e., a trim recipe) for wafer W, as by an equation that takes into account the CD and profile angle measurements as well as characteristics of etcher 370. Etch process parameters that can be adjusted by processor 320 employing such an equation include etch power, etch time, etch gas flow rate and pressure, magnetic field intensity and magnetic field profile.

To obtain correct final CD and profile, both photoresist trim and underlying layer etch recipes can be adjusted for each wafer. For example, final CD is most affected by the trim recipe, and final profile is most affected by the etch recipe. The relationships between measured pre-etch CD and profile, trim and etch recipes, and final CD and profile are determined empirically prior to the start of production. A series of experiments are conducted by first determining pre-etch CD and profile, then performing trim and etch processes, then mapping the results. For example, a series of experiments changing trim time and etch recipe can be conducted to obtain the best results, and to determine how each of the trim and etch recipes affect the final results. The experimental results can be expressed in algorithms or equations which the processor uses during production to calculate the trim and etch parameters.

Figure 4A:
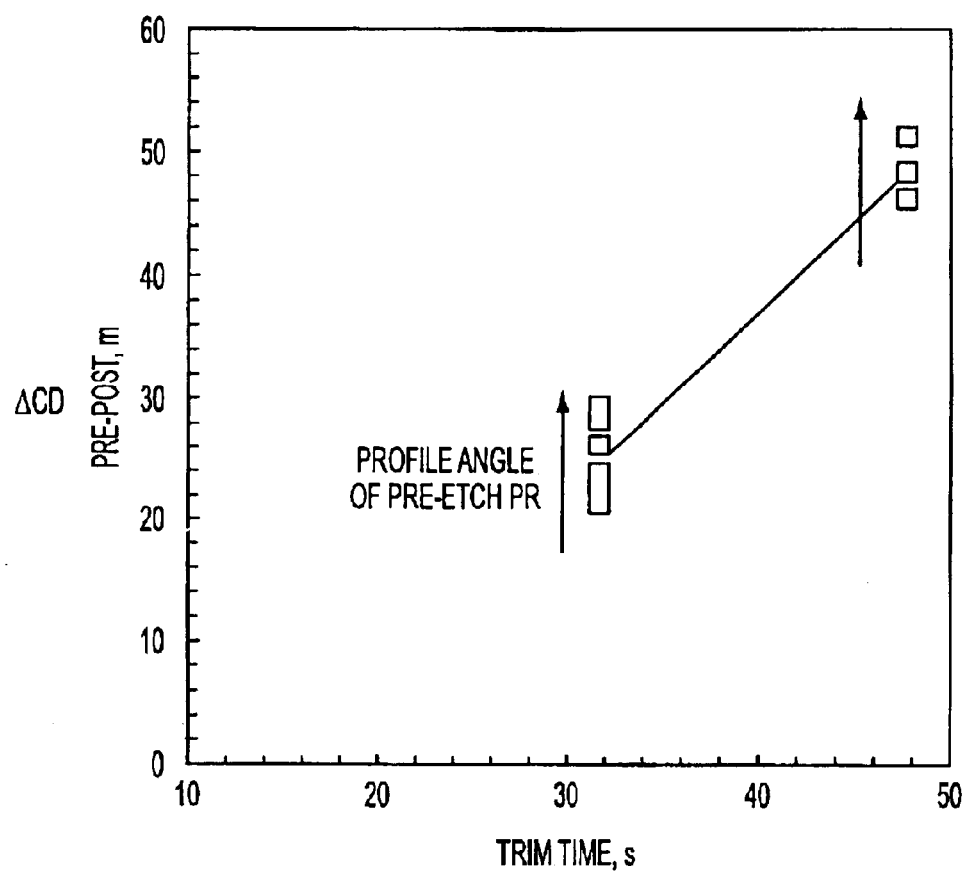
FIGS. 4A–4D are graphical representations of trim process characteristics for use with an embodiment of the present invention.
Figure 4B:
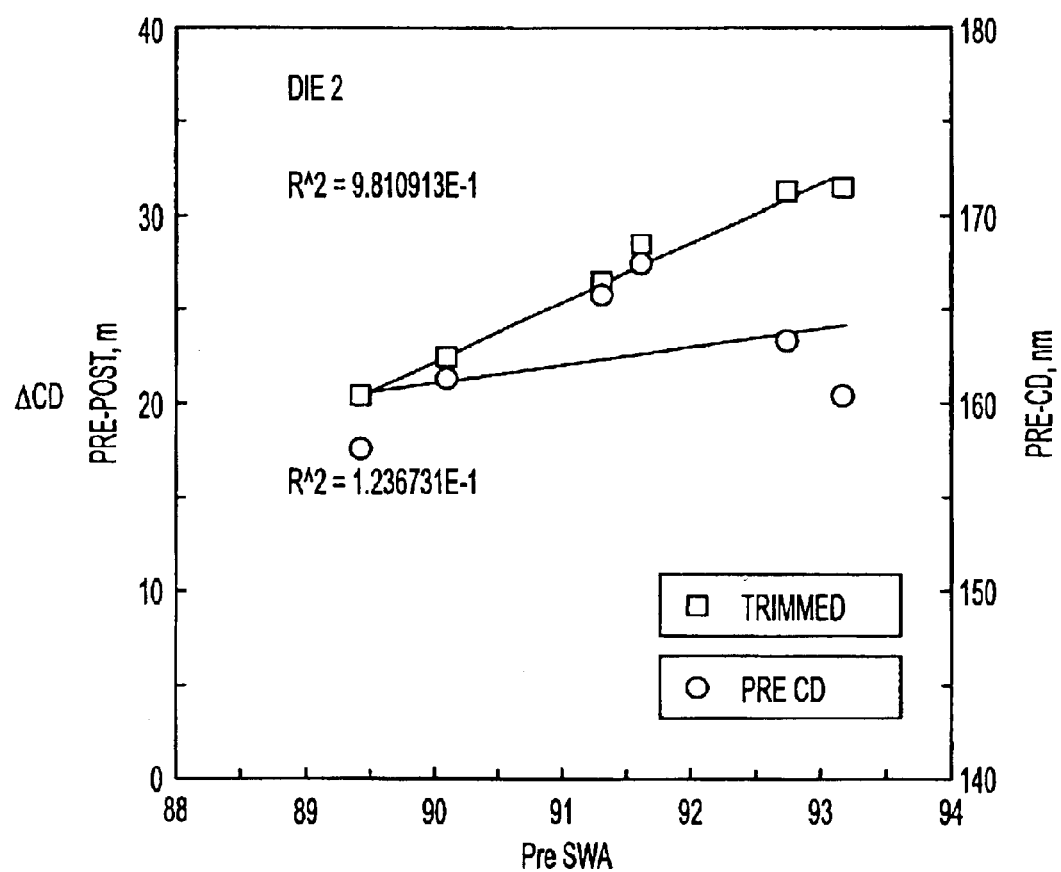

In one embodiment of the present invention, the photoresist trim time is adjusted while the other parameters of the trim recipe, as well as the etch recipe for the underlying layer, are kept constant. In this embodiment of the present invention, before the integrated OCD/etch process can be performed, a "trim curve" for calculating the trim time must be determined. This involves conducting a design of experiments (DOE) wherein a series of wafers is etched with different trim times, keeping the rest of the trim etch recipe constant. FIG. 4A is an example of a trim curve. The amount trimmed (the difference between pre-etch and post-etch CD) is shown to be a function of both trim time and photoresist (PR) sidewall angle. The dependence of the amount trimmed vs. PR sidewall angle (SWA) is plotted in FIG. 4B. To avoid the complication of within wafer non-uniformity due to etcher and pre-etch non-uniformity, the data are taken from the same die of the series of wafers etched under the same conditions. It can be seen in FIG. 4B that the amount trimmed increases with the SWA. This behavior is intuitively correct, since a re-entrant profile (SWA >90°) is conducive to CD loss in an etch process.

Figure 4C:
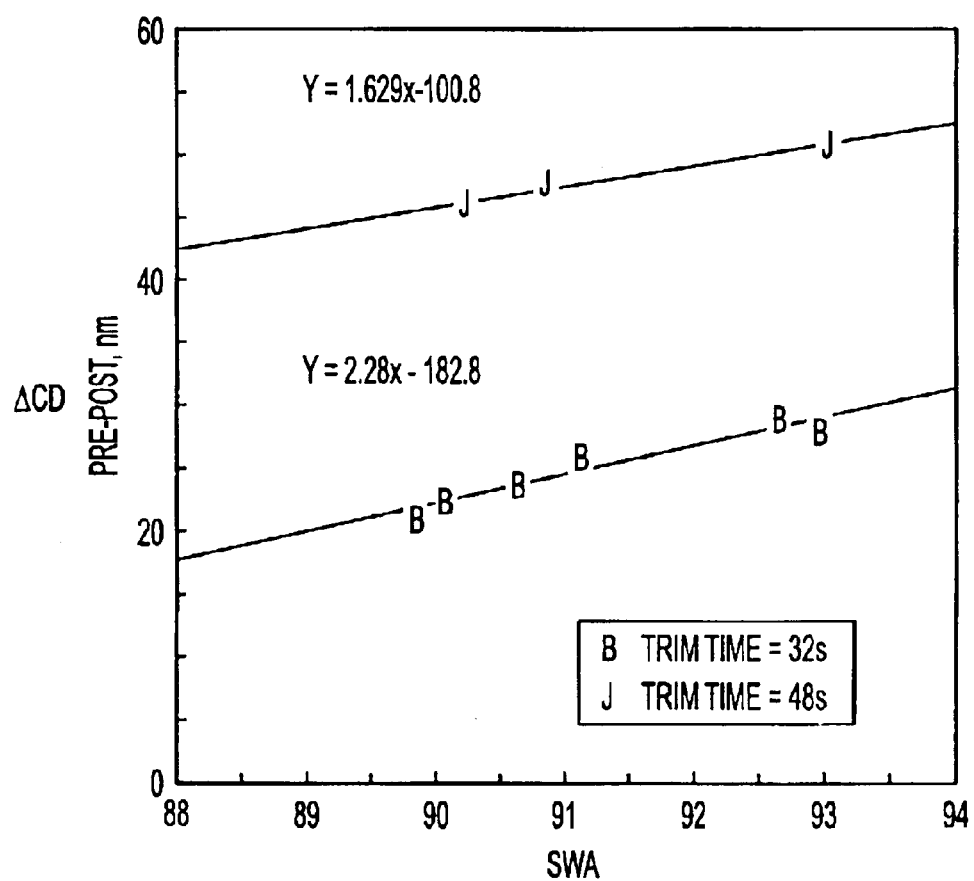

The trim time determination for a given target post-etch CD is illustrated with the trim curve of FIG. 4A plotted as a function of SWA, as shown in FIG. 4C. The dependence of the trim amount on the trim time and sidewall angle can be combined into a single mathematical formula from the two formulas shown in FIG. 4C. If we assume that all responses are linear with time, as shown in FIG. 4C, then the change in CD ("ΔCD") can be expressed in the following equation of a line:

$$\Delta CD = R(A)t + S(A) \quad (1)$$

where t is the trim time and $R(A)$ and $S(A)$ are given by Equations 4 and 5 below. If two trim times for which the trim curve has been determined are referred to as $t_1$ and $t_2$, where $t_2$ is greater than $t_1$, and the sidewall angle is referred to as A, then $$\Delta CDt_2 = R(A)t_2 + S(A) = p_2 A + q_2 \quad (2)$$

and $$\Delta CDt_1 = R(A)t_1 + S(A) = p_1 A + q_1 \quad (3)$$

where p and q are constants obtained from a well-known linear best fit analysis (such constants are shown in the equations in FIG. 4C).

Equations (2) and (3) can be solved for $R(A)$ and $S(A)$ as follows:

$$R(A) = ((p_2 - p_1)A + q_2 - q_1)/(t_2 - t_1) \quad (4)$$

$$S(A) = ((p_1 t_2 - p_2 t_1)A + q_1 t_2 - q_2 t_1)/(t_2 - t_1) \quad (5)$$

Equations (4) and (5) can be substituted into Equation (1) to yield a formula that determines the trim time t necessary to achieve the target post-etch CD for a given pre-etch CD and SWA. This formula is used by processor 320 in step 3100.

Figure 4D:
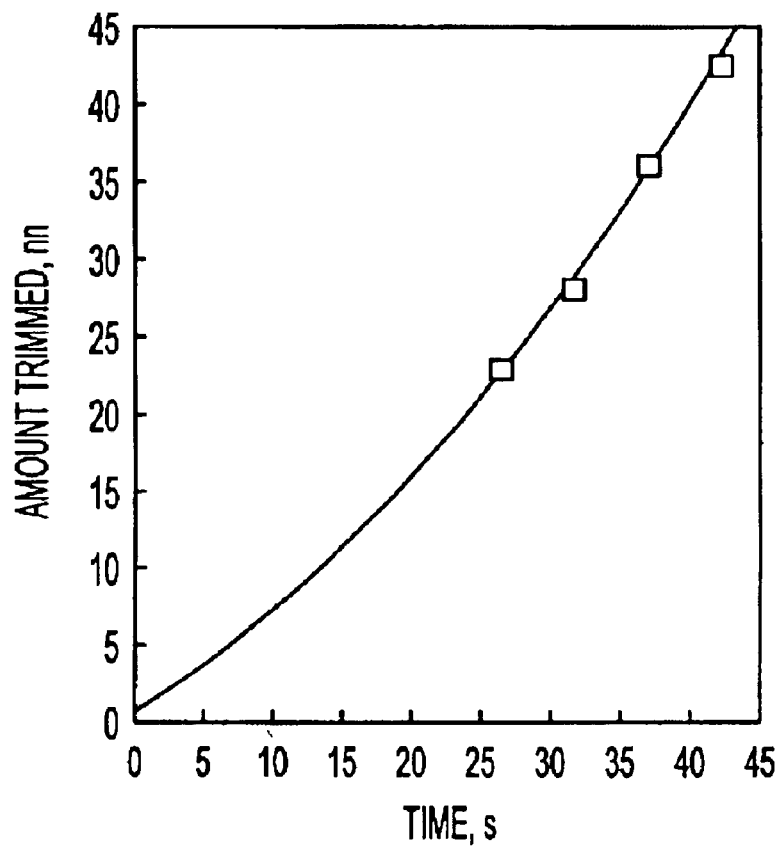

In another embodiment of the present invention, the present methodology also takes into account the fact that trim time versus the amount of photoresist trimmed is non-linear, as shown in FIG. 4D. Thus, the present invention enables more accurate photoresist trimming.

Figure 5A:
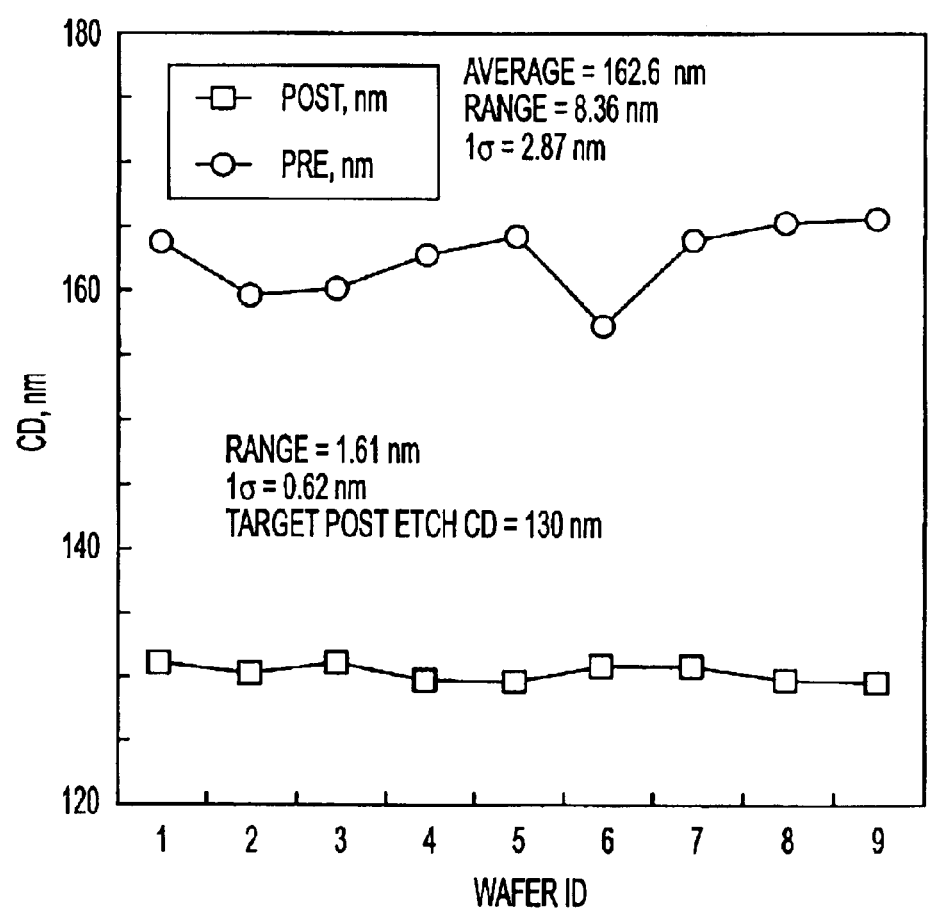
FIGS. 5A–5B are graphical representations of the results of processing wafers using an embodiment of the present invention.

To test the CD control of the methodology of the present invention, a series of wafers was run with a target final CD of 130±1 nm. The average pre-etch CD was 162.6 nm with a full range (maximum-minimum) of 8.36 nm. Nine-point measurements were performed on each wafer, and the average CD and PR SWA for each wafer were fed forward to the etcher. The only change in the entire process sequence was the trim time, which was calculated automatically based on the trim curve information stored in the recipe. FIG. 5A shows the results which indicate that the final post-etch CD distribution is significantly reduced from that of the pre-etch distribution. The full range wafer averaged pre-etch CD decreased from 8.36 nm to a post-etch value of 1.61 nm. The tight control also achieves the final post-etch CD of 130.1 nm, which meets the target range of 130±1 nm.

To obtain these results, it is beneficial to have a very stable etcher, because typically the entire system does not operate on closed loop control. In other words, to be able to use the best known method etch and trim recipes keeping them constant, the etch chamber must first be characterized. For example, the trim curve, shown in FIG. 4A, was determined two days before the wafers used in FIG. 5A were run. The final post-etch CD results indicate excellent etcher stability. In certain embodiments of the present invention discussed below, final CD and profile results can be fed back to processor 320 to adjust the trim curve (and hence trim time) due to drift in the etch step. In this way, lack of long-term etch chamber stability can be taken into account.

Figure 5B:
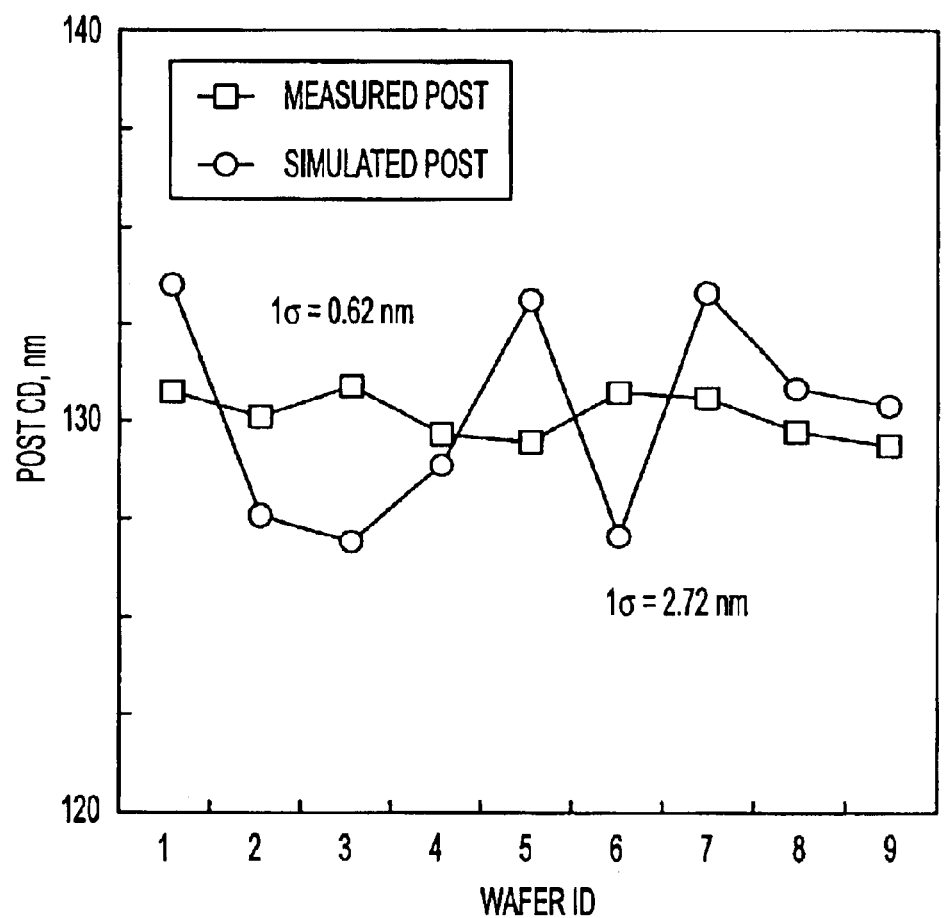

The present invention provides a unique solution to the gate CD control problem that exists today in the semiconductor fabrication industry. It solves this problem by measuring both photoresist CD and profile. The inclusion of the PR profile in the measurement enables, for the first time, a 2nd order correction for the contribution of the PR sidewall angle (the "Theta Transformation"). The importance of the Theta Transformation is shown in FIG. 5B, where the measured post etch CDs obtained with the Theta Transformation are compared with simulated data obtained with only CD correction and no SWA correction. As shown in FIG. 5B, the use of the Theta Transformation tightens the post-etch distribution from 2.72 nm to 0.62 nm.

Referring again to FIG. 3, at step 3200 photoresist layer 250 is etched using the trim recipe (i.e., trim time) determined by processor 320 using the experimentally determined equation. The result is shown at the right side of FIG. 2, wherein patterns P are trimmed to dimension $CD_1$. Underlying layer 210 is then etched, typically at the same etch chamber, in step 3300, resulting in structures S being formed (see bottom right of FIG. 2). Wafer W is thereafter optionally brought to a photoresist ash strip chamber (see step 3400), and brought back to measuring tool 310 at step 3500. The CD and profile of structure S are measured at several locations on wafer W, such as the locations where the pre-etch measurements of photoresist layer 250 were taken at step 3000.

Post-etch CD and profile information is supplied to processor 320, where deviations from target results can be used to adjust the trim and/or etch recipe for the next wafer to be etched. For example, from the measured CD and profile and the previously developed DOE modelling, etcher process drift can be determined; that is, etcher process "age" or where the etcher is on its process timeline. The etch recipe can then be adjusted for the next wafer, so the etch results are closer to the target. Post-etch information can also be fed back to processor 320 to discover and correct for problems in previous processes; for example, if the photoresist on a batch of wafers was baked at the wrong temperature, its trim rate will be different. Thus, if the first etched wafer is measured and this mistake is discovered, the trim time can be adjusted by processor 320 for the rest of the wafers to compensate. Moreover, if the measured dimensional variation is outside predetermined boundaries, or if the processing results change dramatically from one wafer to the next, an alarm can be generated to indicate the etcher should be taken out of service; e.g., for repairs or maintenance.

Although the foregoing embodiment of the present invention adjusts the photoresist trim time while keeping the rest of the trim recipe and the underlying layer etch recipe constant, it should be appreciated that in further embodiments of the present invention, other trim parameters can be variable for each wafer, and the underlying etch recipe can be variable for each wafer. For example, the etch and/or trim recipes can be adjusted to compensate for dense to isolateral CD bias changes from one wafer to the next. Such embodiments require an appropriate DOE to develop the proper equations for use by processor 320 to choose the trim/etch process parameter values.

It should also be appreciated that the present methodology of adjusting an etch recipe based on measured CD and profile is not limited to the photoresist trim process. It can also be employed when a photoresist trim is not performed. Since post-etch profile is dependent on photoresist profile, the post-etch profile of any etched pattern can be fine-tuned based on the measured photoresist profile sidewall angle using the present methodology.

In further embodiments of the present invention, an apparatus for processing a semiconductor wafer is provided wherein a wafer is removed from a wafer cassette, and a CD and profile of a pattern on a patterned layer formed on the wafer is measured using an optical measuring tool. A process, such as an etch process, is then performed on the wafer using a set of process parameter values, such as a trim or etch recipe, selected based on the pattern CD and profile measurements. Post-etch processing, such as ash stripping and wet cleaning, are optionally performed by the apparatus, then a CD and profile of a structure formed in the underlying layer by the etch process are measured at several locations before the wafer is returned to a cassette. The post-etch measurements are fed back to the etcher to adjust the etch recipe for a subsequent wafer. All of the transfer and processing steps performed by the apparatus are performed in a clean environment, thereby increasing yield by avoiding exposing the wafer to the atmosphere and possible contamination between steps.

These embodiments of the present invention provide for pre-etch CD and profile measurements of every wafer and adjustment of the photoresist trim/etch recipe for every wafer according to its CD and profile measurements to correct for process variations in previously visited tools, such as deposition uniformity variations at a deposition module and/or exposure and focus variations at a photo cell. The present invention also provides for etch recipe adjustment for etcher process drift.

An apparatus for processing a semiconductor wafer according to an embodiment of the present invention will now be described with reference to FIG. 6A. The apparatus comprises a chamber or "mainframe" 901, such as the Centura™ processing system, available from Applied Materials of Santa Clara, Calif., for mounting a plurality of processing chambers, e.g., conventional etch processors 902, such as DSPII™ polysilicon etch chambers available from Applied Materials of Santa Clara, Calif., and one or more transfer chambers 903, also called "load locks". In one embodiment of the present invention, four etch processors 902 are mounted to mainframe 901. In one exemplary embodiment, three etchers 902 are used for etching, and one is optionally used for post-etch cleaning (i.e., removing photoresist polymers and other residue from wafers after etching). Mainframe 901 is capable of maintaining a vacuum environment in its interior. A robot 904 is provided for transferring wafers between processing chambers 902 and transfer chambers 903.

Transfer chambers 903 are connected to a factory interface 905, also known as a "mini environment", which maintains a controlled environment. A measurement tool 906, such as an optical measurement tool utilizing scatterometry or reflectometry techniques, is mounted inside factory interface 905. An example of a tool that can be used as measurement tool 906 is measuring tool 310 described above (see FIG. 1), which can include the measurement tool described in U.S. Pat. No. 5,963,329. A processor (i.e., a processor corresponding to processor 320) to provide etcher 902 an etch recipe based on the wafer CD and profile measurements as described above can be part of etcher 902 or mainframe 901. One or more robots 907, or a track robot, are also mounted inside factory interface 905 for transferring wafers between transfer chambers 903, measurement tool 906 and standard wafer cassettes 908 removably attached to factory interface 905. Mainframe 901, transfer chambers 903, factory interface 905 and robots 904, 907 are all parts of a conventional processing system such as the Applied Materials Centura™, and communicate with each other while maintaining a clean, controlled environment. Such conventional processing systems further comprise a processor, such as a computer (not shown) to electronically control the operation of the system, including the transfer of wafers from one part of the system to another.

Figure 7:
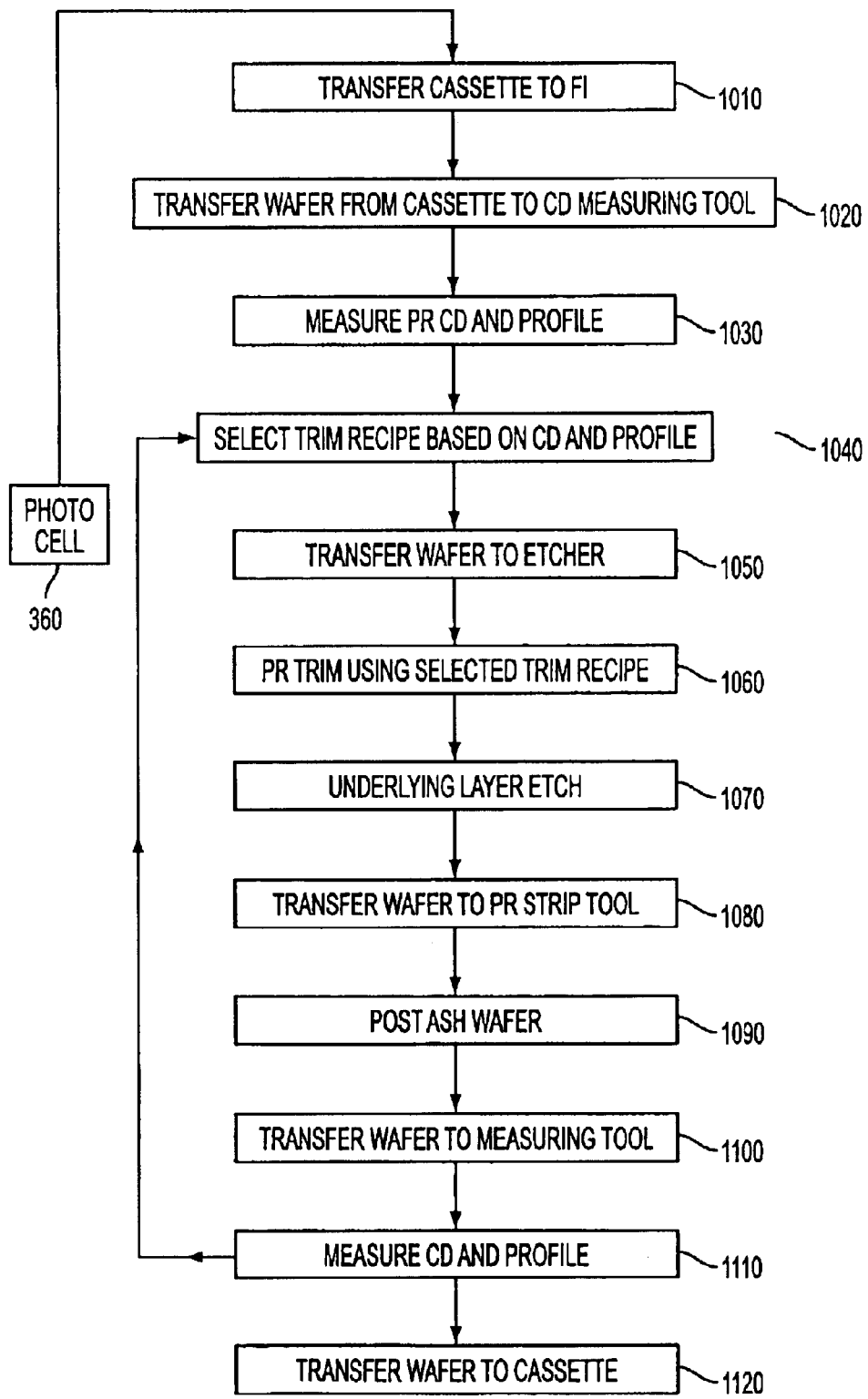
FIG. 7 is a flow chart illustrating sequential steps in a method according to an embodiment of the present invention.

The operation of the apparatus according to this embodiment of the present invention will now be described with reference to the flow chart of FIG. 7. After a plurality of wafers are processed at a processing tool, such as a photo cell as described above, to form a photoresist mask on an underlying layer, they are loaded into a cassette 908, and the cassette is transferred to factory interface 905 at step 1010. A wafer is then unloaded from cassette 908 and transferred to measurement tool 906 by robot 907 (step 1020), and the CD and profile of a pattern on the photoresist are measured at step 1030. At step 1040, a photoresist trim recipe for the wafer is selected based on the CD and profile measurements, as explained above.

At step 1050, the wafer is transferred from measurement tool 906 to etcher 902 using robot 907 to move the wafer to transfer chamber 903, and using robot 904 to move the wafer to etcher 902. The photoresist layer is trimmed (step 1060), the wafer is then etched (step 1070), typically in the same etcher 902. Next, in certain embodiments of the present invention, the wafer is transferred to a photoresist stripping chamber 902 (step 1080), such as a conventional ash strip chamber, for removal of the photoresist (step 1090). The wafer is then transferred back to measurement tool 906 for a post-etch CD and profile measurement (steps 1100 and 1110) before being loaded into cassette 908 at step 1120. The post-etch CD and profile measurements are sent to processor 320, and used to correct the trim curve and/or etch recipe for the next wafer to be etched, as explained above.

Figure 6A:
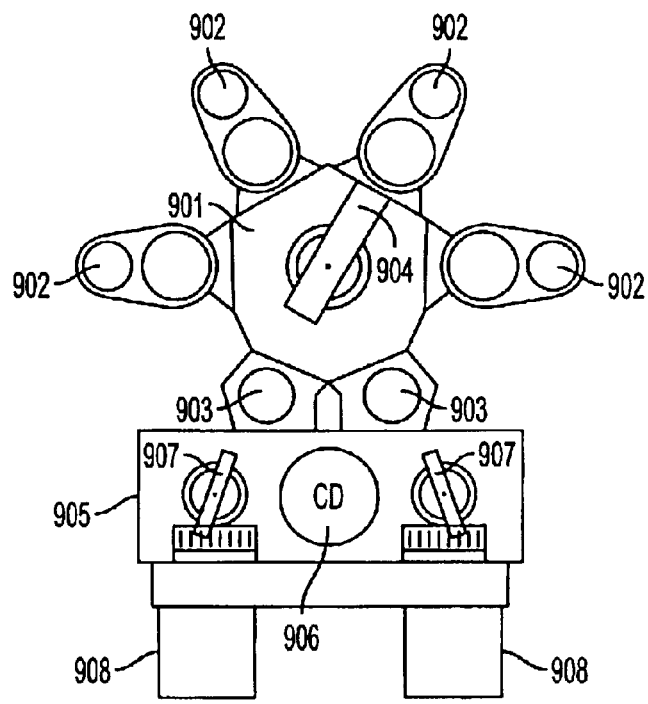
FIGS. 6A–E schematically illustrate processing modules according to embodiments of the present invention.
Figure 6B:
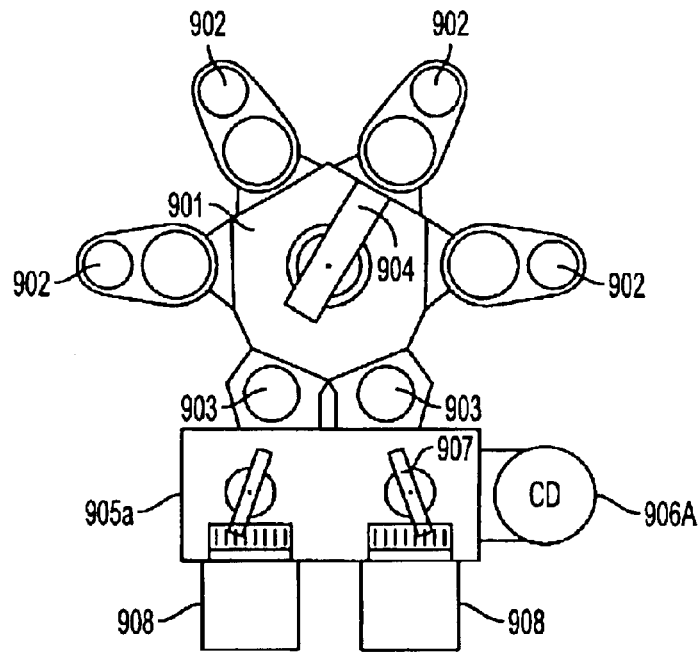

In a further embodiment of the present invention shown in FIG. 6B, factory interface 905a has a CD measurement tool 906a mounted to it (instead of inside it as in the embodiment of FIG. 6A). The apparatus of FIG. 6B operates according to the flow chart of FIG. 7 as described above.

Figure 6C:
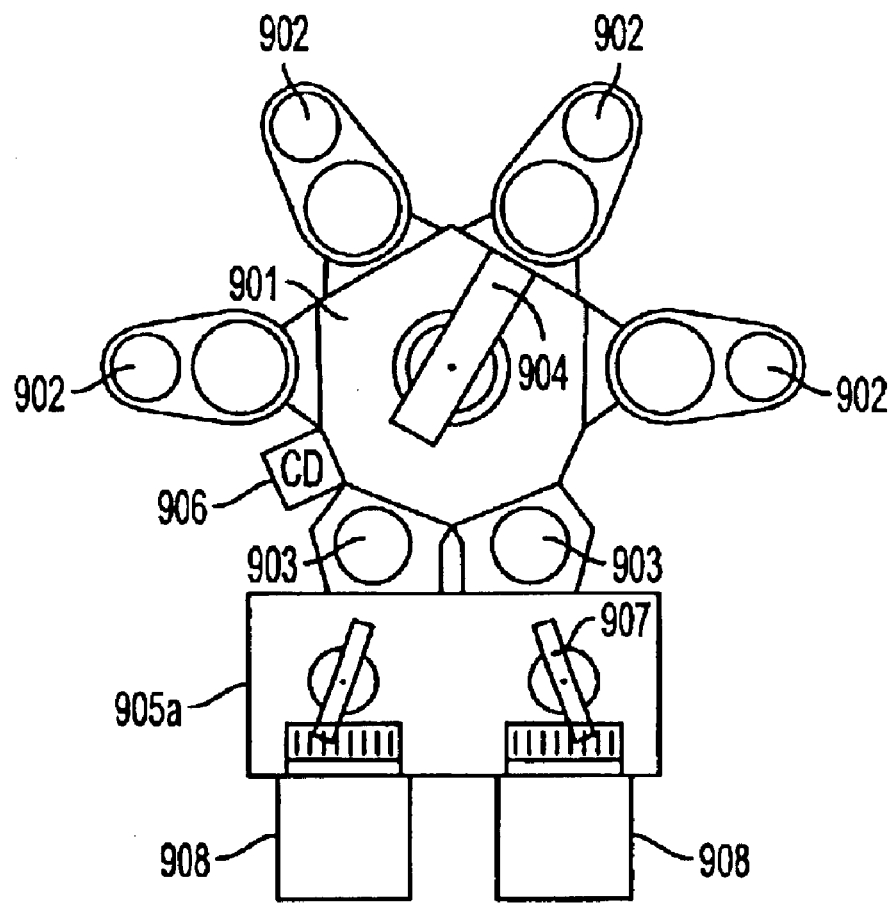

In a still further embodiment of the present invention illustrated in FIG. 6C, measurement tool 906a is mounted on mainframe 901 rather than factory interface 905a. The apparatus of FIG. 6C operates according to the flow chart of FIG. 7 as described above.

Figure 6D:
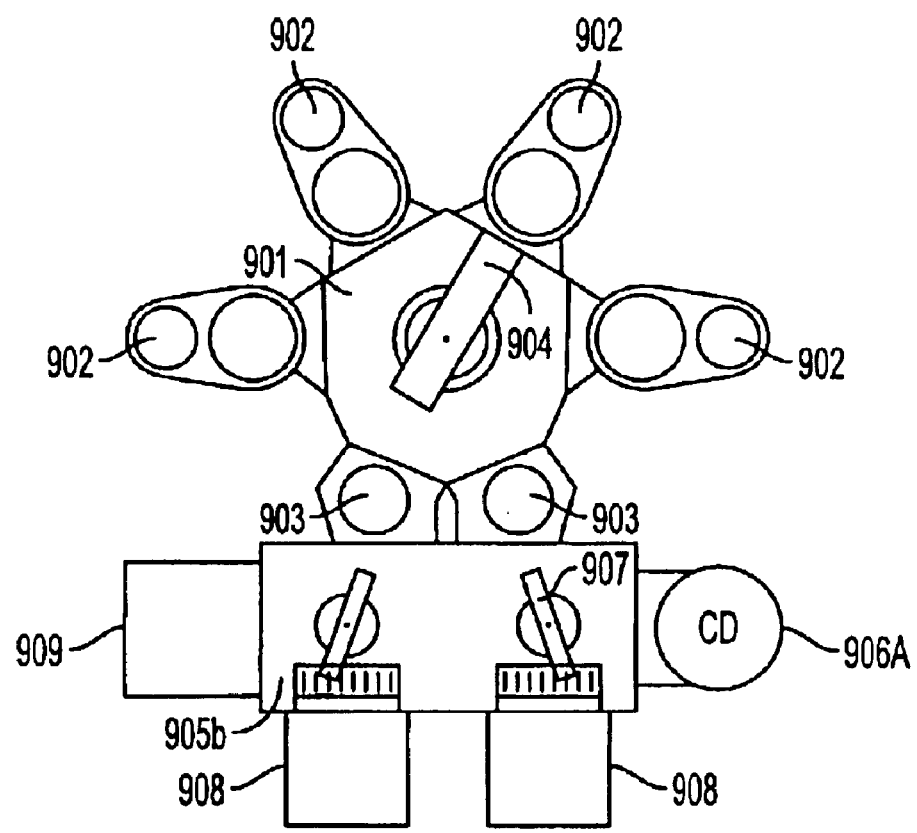

In another embodiment of the present invention illustrated in FIG. 6D, factory interface 905b has a measurement tool 906A and a conventional wet clean chamber 909 mounted to it. Wet clean chamber 909 can be a single wafer cleaning station using ultrasonic transducers. One of the chambers 902 on mainframe 901 is a conventional ash strip chamber, as discussed above. After a wafer is etched, it is transferred to ash strip chamber 902 for photoresist removal (steps 1080 and 1090 of FIG. 7), then it is transferred to wet clean chamber 909 and cleaned prior to or after being transferred to measurement tool 906A in step 1100.

Figure 6E:
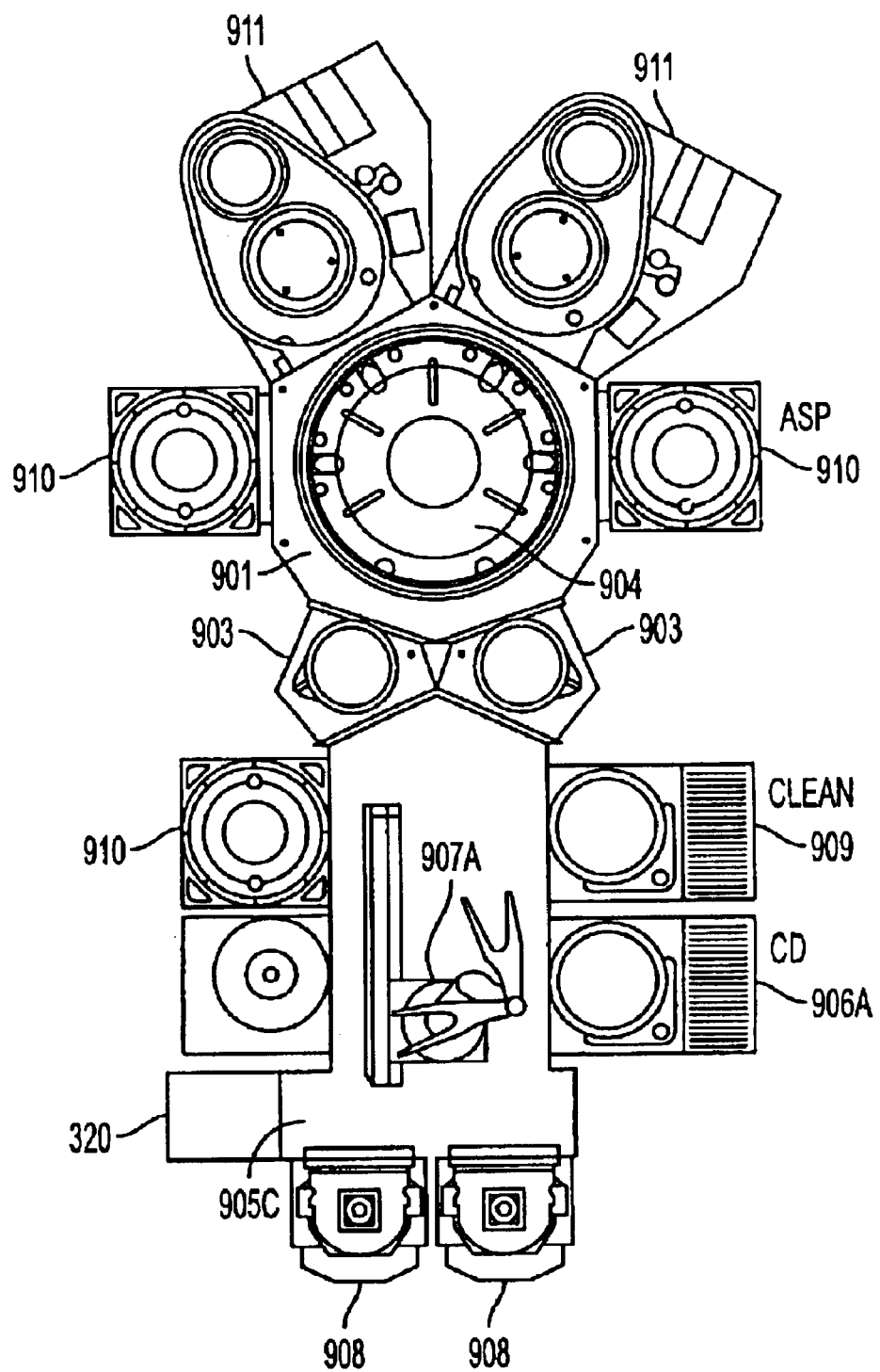

In another embodiment of the present invention illustrated in FIG. 6E and fully described in U.S. patent application Ser. No. 09/945,454, filed Aug. 31, 2000, mainframe 901 is the Applied Materials' Centura™ and factory interface 905C is the Link™, also available from Applied Materials. Factory interface 905C has a single robot 907A, a measurement tool 906A as described above, a conventional wet clean chamber 909 as described above, and a conventional ash strip chamber 910 mounted to it. Additionally, two of the ash strip chambers 910 are mounted on mainframe 901, along with two conventional etchers 911. Alternatively, four etchers 911 can be mounted to mainframe 901 instead of ash strip chambers 910. After a wafer is etched, it is transferred to one of the ash strip chambers 910 for photoresist removal (steps 1080 and 1090 of FIG. 7), then it is transferred to wet clean chamber 909 and cleaned prior to or after being transferred to measurement tool 906A in step 1100.

The embodiments of the present invention illustrated in FIGS. 6A–E provide pre-etch CD, and profile measurement, etching, cleaning, and post-etch CD measurement entirely under controlled environmental conditions. By providing etching, cleaning and measurement tools on the mainframe and/or factory interface, the wafer can be etched, cleaned and inspected before being returned to a cassette, thereby reducing processing time and cost. Moreover, the embodiments of FIGS. 6A–D provide feedback and feed forward of measurement data in real time for every wafer, thereby enabling etch processing to be customized for every wafer to increase yield. Thus, the present invention provides increases in yield and decreases in production costs vis-a-vis prior art systems, wherein feedback from CD measurements, if any, is on a lot-to-lot basis rather than for every wafer, and wafers must be exposed to the atmosphere between measuring, etching and cleaning steps.

In a further embodiment of the present invention, a method and apparatus for processing a semiconductor wafer is provided which enables realtime CD microloading control. The goal is to perform the etch process to maintain the initial microloading, so that no CD is added or subtracted from any etched pattern. The present invention accomplishes this goal by measuring a CD of an isolated pattern of a patterned photoresist layer, and measuring a CD of a dense pattern that is one of a plurality of patterns of the patterned layer disposed proximal to each other. The trim recipe and the etch recipe to be performed on the wafer are selected responsive to the measurements of the isolated-pattern CD and the dense pattern CD. Thus, this embodiment of the present invention includes a feed forward mechanism to enable a processor to automatically choose trim and etch recipes according to pre-etch microloading conditions and post-etch microloading requirements. The trim and etch recipe selection is based on algorithms and/or equations which express the results of experimentation.

FIG. 8 illustrates the problem of CD microloading control addressed by this embodiment of the present invention. Line 810 relates to the pre-etch condition of a theoretical ideal Wafer 1. Wafer 1's dense patterns have a CD of 100 $\mu$m, while its isolated lines have a CD of 90 $\mu$m, for a microloading of 10 $\mu$m. Line 820 represents the post-etch (i.e., photoresist trim) goal, which is to decrease the CD of both the dense and the isolated patterns of Wafer 1 and maintain the 10 $\mu$m microloading. Line 830 shows the pre-etch condition of an actual Wafer 2, whose microloading is 15 $\mu$m rather than the ideal 10 $\mu$m, due to the variation of isolated and dense patterns. Line 840 illustrates the result of using a feedforward system, such as described hereinabove with reference to FIG. 3, which typically measures only dense pattern CDs (i.e., does not choose a trim recipe based on measurements of both isolated and dense pattern CDs). In this case, the dense line CD of 95 $\mu$m is fed forward to the etcher, which knows the goal is 80 $\mu$m for dense patterns (as shown in line 820), and chooses the trim recipe accordingly. Unfortunately, the isolated pattern CD shrinks too much using this trim recipe, resulting in a larger-than-desired microloading of 15 $\mu$m.

Line 850 shows the pre-etch condition of a Wafer 3 that is identical to Wafer 2. Line 860 shows the results of using this embodiment of the present invention, wherein isolated and dense patterns are both measured, and their measurements are taken into account when choosing the etch recipe. The present invention enables recipes to be chosen such that the isolated and dense patterns are not trimmed by the same amount; e.g., the dense patterns are trimmed by 15 $\mu$m and the isolated patterns are trimmed by 10 $\mu$m. The result is that the CDs of the patterns meet the desired post-etch requirements, and the microloading is the desired 10 $\mu$m. In other words, the present invention allows the post-etch CDs of isolated and dense patterns, which are different from each other, to be independently "targeted" regardless of their pre-etch CDs.

Figure 9:
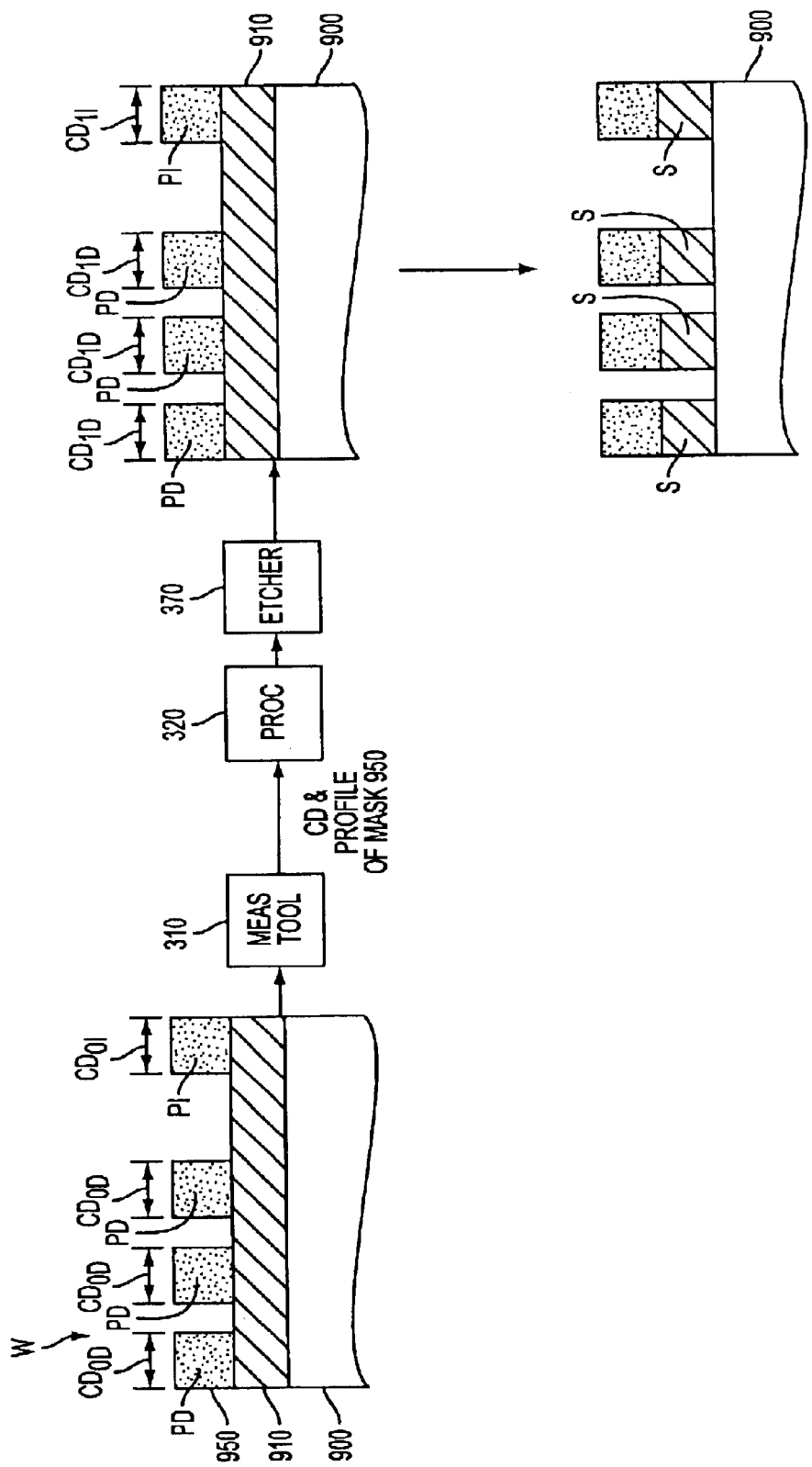
FIG. 9 is a process flow diagram for an embodiment of the present invention.

An embodiment of the present invention will now be described in detail with reference to FIGS. 1, 9 and 10. This embodiment of the present invention can be implemented using an apparatus as described above with reference to FIG. 1. Referring now to the process flow diagram of FIG. 9, wafer W to be processed by a dielectric etcher comprises a substrate 900 upon which is formed a conductive layer 910, such as a polysilicon layer by deposition processing. A patterned photoresist layer 950 (i.e., a photoresist mask formed at photo cell 360) having dense patterns PD and isolated patterns PI, such as line patterns, is formed on conductive layer 910. Isolated pattern PI is spaced at least about 5 line widths (i.e., five times a nominal CD) from the closest pattern on patterned layer 950, and dense patterns PD are spaced from about 1 to about 3 line widths from the closest pattern on patterned layer 950. An anti-reflective coating (ARC) layer (not shown) may be formed in a conventional manner between conductive layer 910 and photoresist layer 950 to aid the photolithographic process. Alternatively, a silicon nitride layer (not shown) can be formed on conductive layer 910 that is to be patterned to form a "hard mask" by etching using photoresist layer 950. Dense patterns PD have an initial CD referred to as $CD_{OD}$ in FIG. 9, and isolated pattern PI has an initial CD referred to as $CD_{OI}$.

Figure 10:
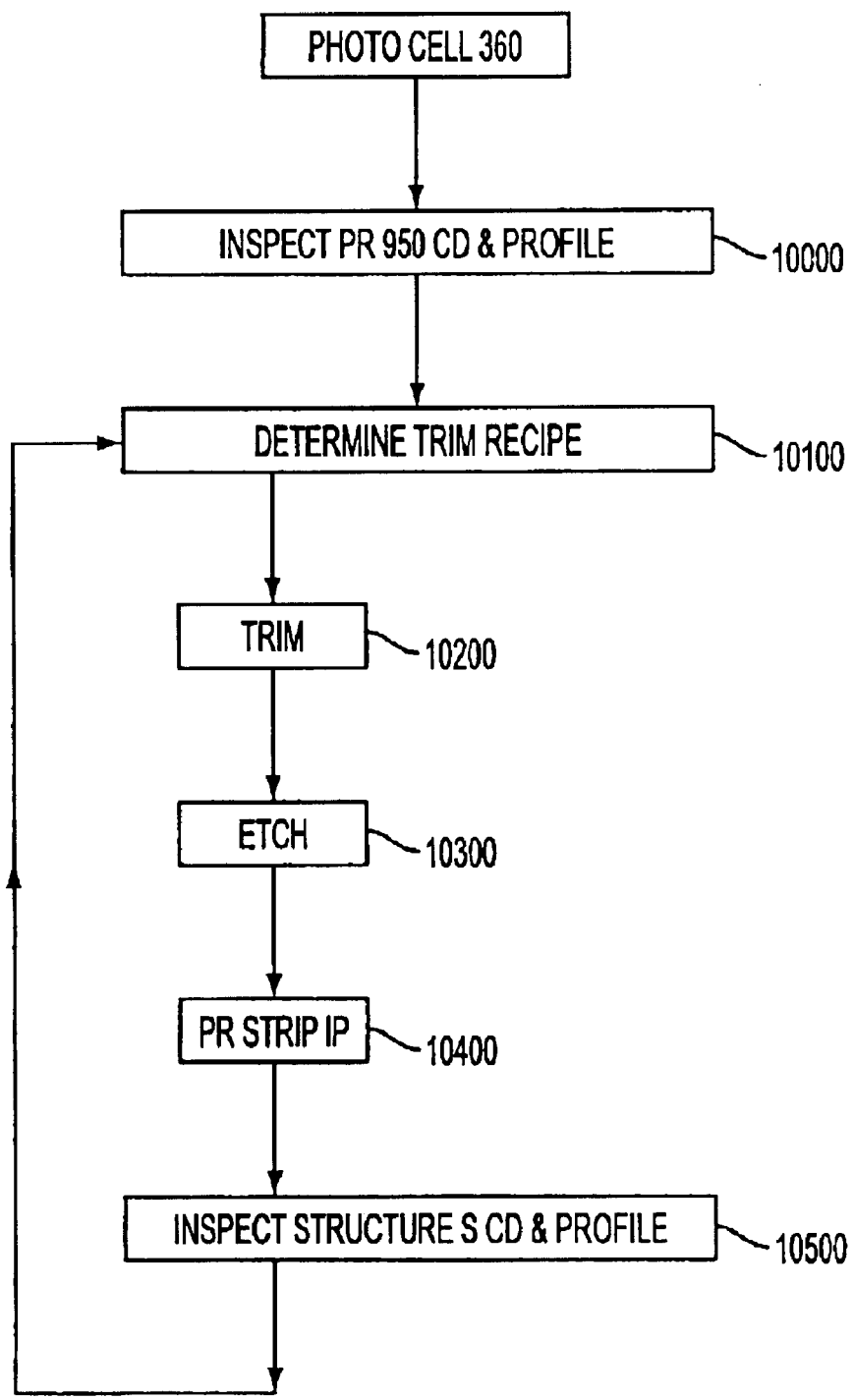
FIG. 10 is a flow chart illustrating sequential steps in a method according to an embodiment of the present invention.

As shown in the flow chart of FIG. 10, wafer W is brought from photo cell 360 to measuring tool 310 at step 10000, where the CD of patterns PD and PI are optically measured. The profile of patterns PD and PI can also be measured at this time. As discussed in detail hereinabove, measuring tool 310 can directly measure CD and profile of certain patterns on photoresist layer 950, such as trenches and the like, using conventional optical inspection techniques, e.g., RCWA. The CD and profile measurements are typically taken at several locations (i.e., dies) on wafer W. The number of measurements is ultimately limited by the throughput of measuring tool 310 and the etch process throughput requirements, and is influenced by the process' maturity and past performance. Generally, the less mature the process, the greater the number of measurements should be taken. Typically, about nine dies are measured per wafer, two lines per die (one isolated line and one dense line), at a different location on each die. The CDs and profiles of the measured features can then be averaged before being employed in subsequent steps of the present methodology. Measurement is done on a conventional line and space grating. For example, an isolated pattern can be defined as a pattern having a line to space ratio from about 1:5 to about 1:10, while a dense pattern can be defined as a pattern having a line to space ratio of about 1:1 to 1:3.

The measured CD and profiles are used by processor 320 at step 10100 to determine etch process parameters (i.e., a trim recipe and an etch recipe) for wafer W, as by an equation that takes into account the CD and profile angle measurements as well as characteristics of etcher 370. Other photoresist parameters, such as photoresist thickness, underlying layer thickness, pattern density and open area, can also be measured by measuring tool 310 or otherwise determined, and taken into account (as discussed in greater detail below) when processor 320 chooses the etch recipes. Etch process variables that can be adjusted by processor 320 include etch power, etch time, etch gas flow rate and pressure, magnetic field intensity and magnetic field profile.

To obtain correct final CD and profile and the desired microloading, both photoresist trim and underlying layer etch recipes can be adjusted for each wafer. For example, under typical conditions, isolated lines trim faster than dense lines during the photoresist trim process, but etch more slowly than dense lines during polysilicon etching. The relationships between measured pre-etch CD and profile, trim and etch recipes, and final CD and profile are determined empirically prior to the start of production. A series of experiments are conducted by first determining pre-etch CD and profile, then performing trim and etch processes, then mapping the results. For example, a series of experiments changing trim time and etch recipe can be conducted to obtain the best results, and to determine how each of the trim and etch recipes affect the final results. The experimental results can be expressed in algorithms or equations which the processor uses during production to calculate the trim and etch parameters. For example, the same empirical data can be used for processing wafers having the same pattern density, if they also have the same film stack. Processor 320 has access to the data and/or equations, and can be instructed to select the process conditions for different wafers based on their pattern density.

Such a set of equations is illustrated as follows, wherein pre-etch CD and profile measurements are used to determine an etch recipe to obtain a desired post-etch microloading:

$$\Delta_D = P_D - C_D = f(T, V, Q) \tag{1}$$

$$\Delta_I = P_I - C_I = g(T, V, Q) \tag{2}$$

In equations (1) and (2), $P_D$ is the pre-etch dense line CD, $C_D$ is the target dense line CD, T is the trim time, V is a pre-etch parameter which is pre-determined by a pre-etch measurement, Q is a process variable which effects the trim rate, $P_1$ is the pre-etch isolated line CD, and $C_1$ is the isolated line target CD. The photoresist parameter, V, can be a multitude of parameters, such as photoresist sidewall angle, photoresist thickness, underlying layer thickness, etc. V can also include pattern density or open area (the percentage of wafer area not covered by photoresist). The process variable Q can include one or more of source power, oxygen flow, etc. The functions f and g are the trim control graphs for dense and isolated lines, respectively. These two control graphs are determined empirically. The two unknowns, T and Q, can be solved from equations (1) and (2).

Figure 11A:
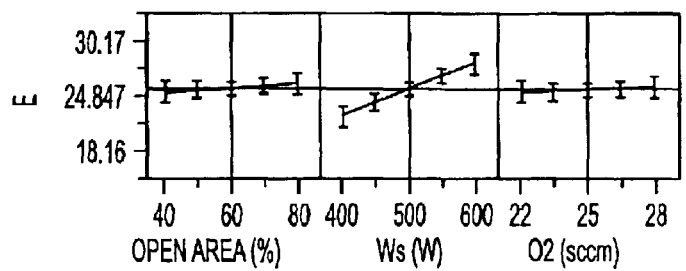
FIGS. 11a–16c are graphical representations of trim and etch process characteristics for use with an embodiment of the present invention.
Figure 11B:
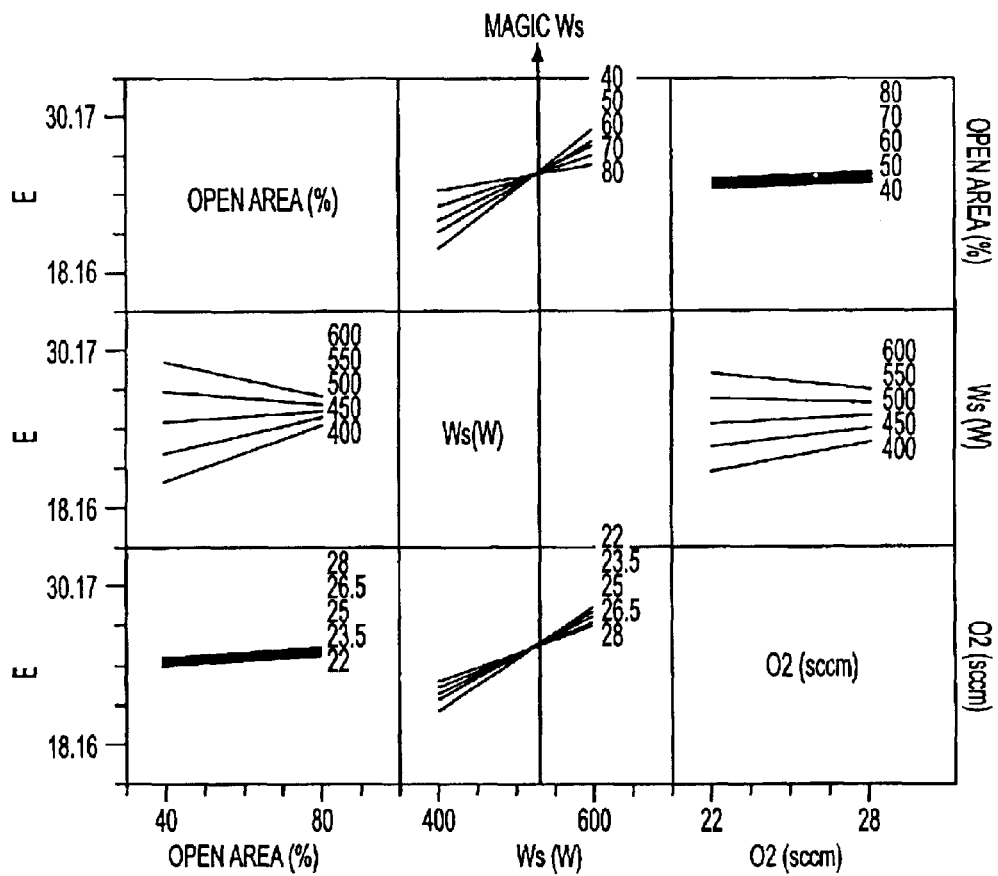

FIGS. 11a–16c are the results of experiments that illustrate how several exemplary photoresist parameters and process variables affect microloading, and can be considered when determining trim and etch recipes to use when practicing the present invention. FIGS. 11a–b illustrate how microloading, expressed on the vertical axes of the graphs as a percentage (E), is affected by the photoresist parameter of percentage open area (Open Area), and the etch variables of oxygen flow (O2) and source power (Ws). FIGS. 11a–b show that Ws has a strong effect on microloading during the photoresist trim step. This is because microloading is a result of a difference in radical concentration in open and dense areas of the photoresist. FIGS. 11a–b also show that O2 and Open Area have a less strong effect on microloading during the trim process. As can be seen in FIG. 11b, there is a significant interaction between Open Area and Ws. However, the Applicants have identified a "Magic Ws", which results in microloading insensitive to Open Area and O2 flow.

Figure 12A:
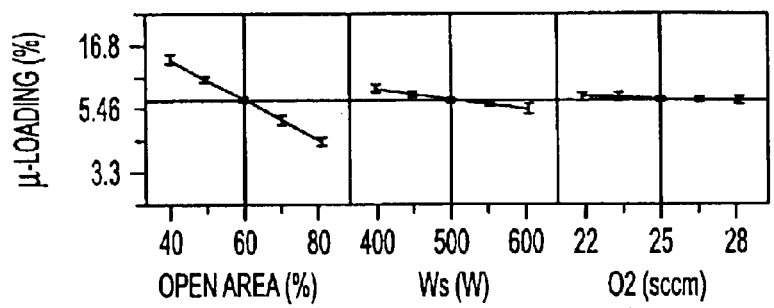
Figure 12B:
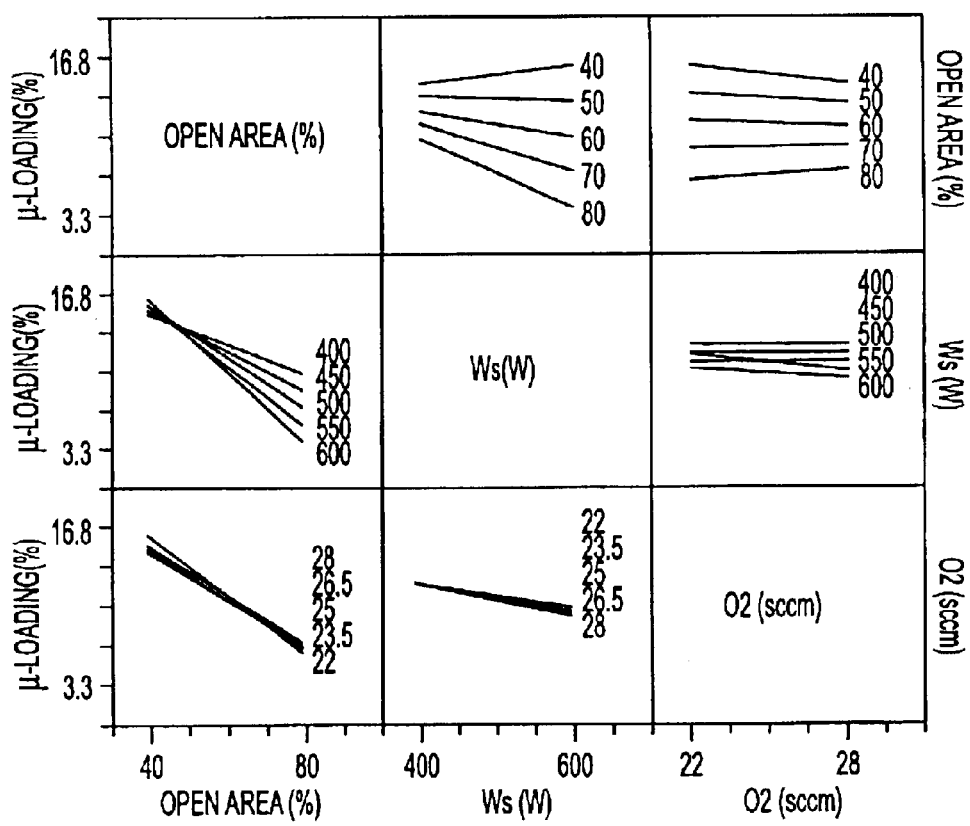

The graphs in FIGS. 12a–b show that during the polysilicon gate etch step (i.e., etching of the underlying layer following a photoresist trim step), unlike during the trim step, Open Area has a significant effect on microloading, and that the graph of microloading vs. Open Area passes through zero. Since in FIGS. 12a–b, Ws and O2 are variables of the trim step, it can further be seen that Ws of the trim step has a significant effect on polysilicon microloading if the Open Area percentage is high.

Figure 13A:
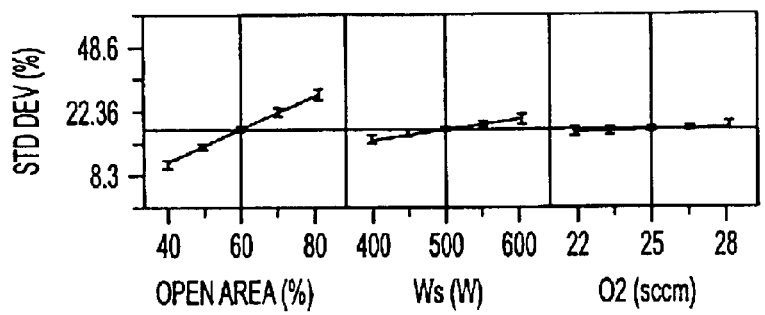
Figure 13B:
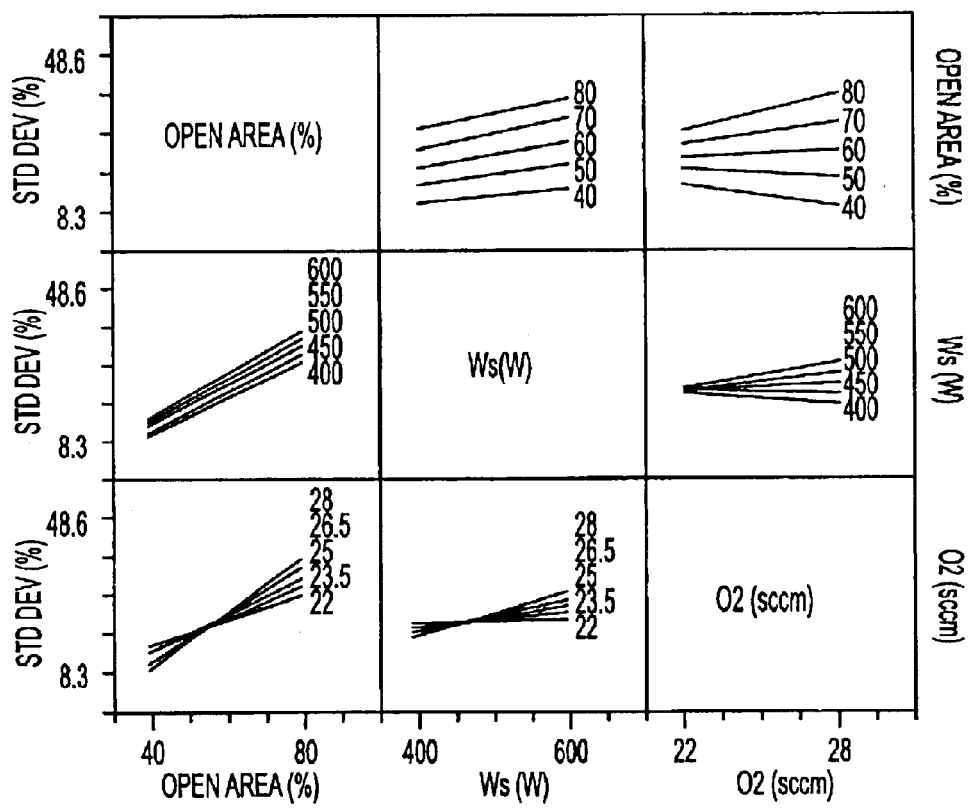

FIGS. 13a–b illustrate the observed percentage uniformity (shown on the vertical axes) of the polysilicon etch step from wafer to wafer. This is an important process performance result to consider when choosing etch recipes, since the etch recipe is changed for every wafer when practicing the present invention, and uniformity of results is desireable for purposes of quality control.

Figure 14A:
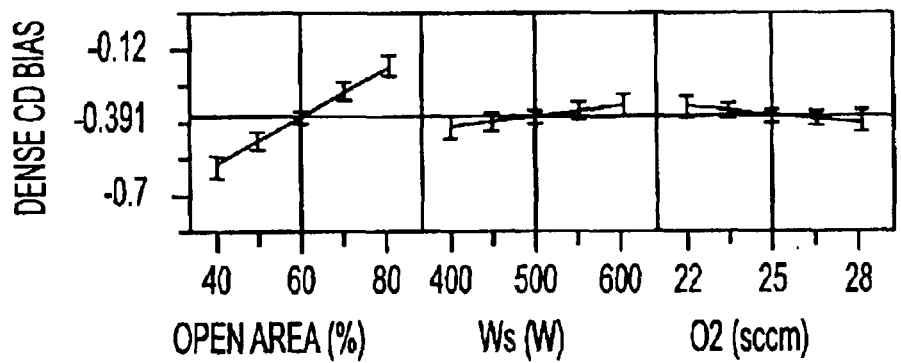
Figure 14B:
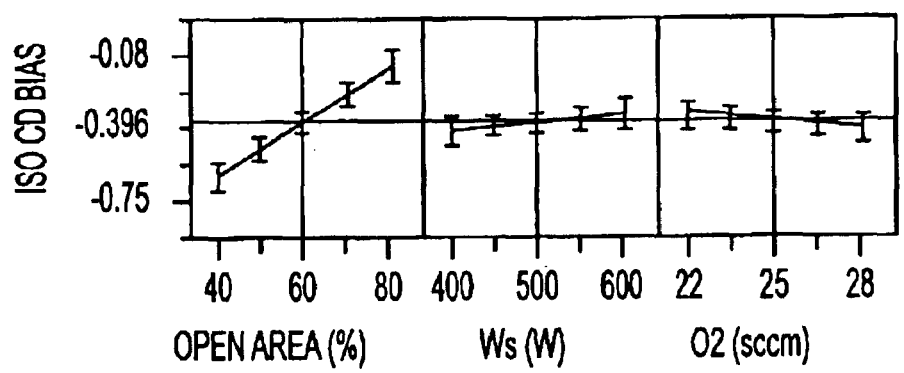

FIGS. 14a–b illustrate the interaction between the photoresist trim step and the underlying layer etch process. FIG. 14a shows the variability of dense line CD bias (on the vertical axis), and FIG. 14b shows variability of isolated line CD bias. CD bias is defined as pre-etch CD minus post-etch CD. Since the polysilicon etch recipe was kept constant during this DOE, the change in CD bias in the polysilicon etch step is due entirely to the interaction between the trim step and the polysilicon etch step. Thus, it can be seen that changing the photoresist trim recipe affects polysilicon etch performance. Therefore, if one of the trim or etch processes is changed, consideration should be given to how it affects the other when practicing the present invention.

Figure 15A:
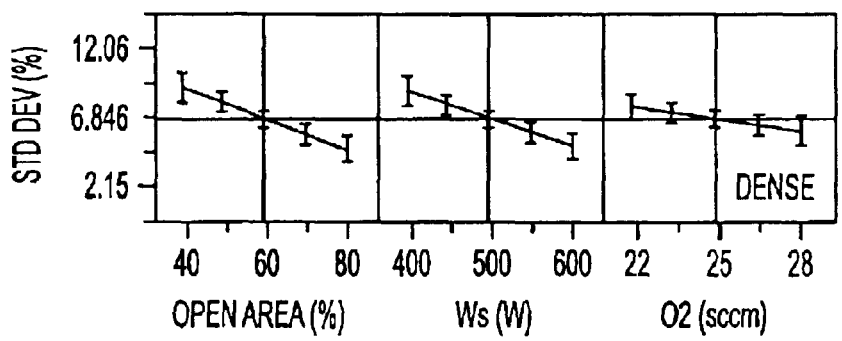
Figure 15B:
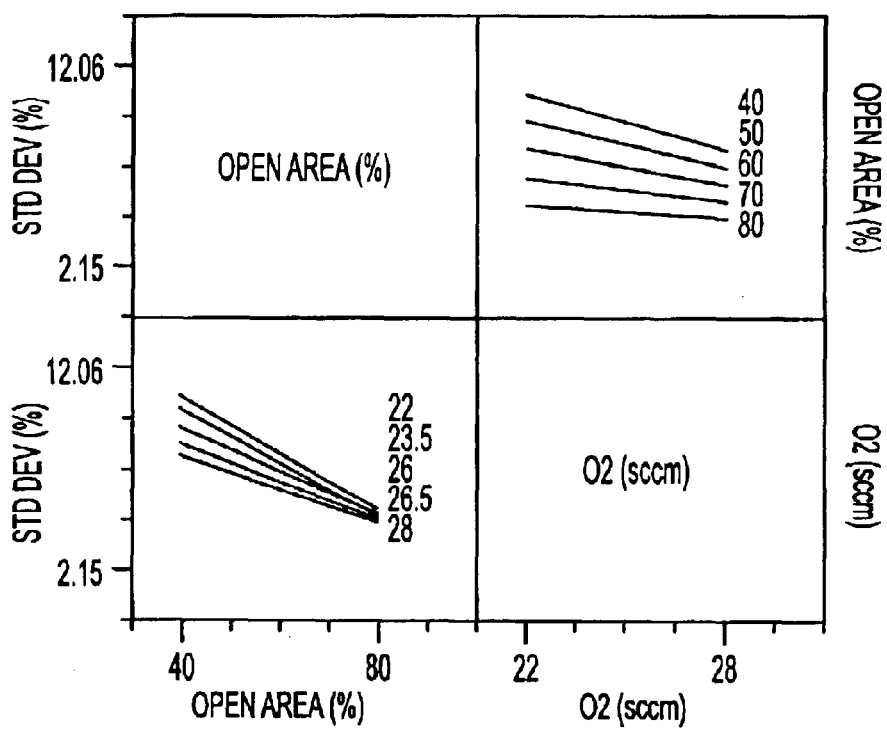

FIGS. 15a–b illustrate the observed uniformity (shown on the vertical axes) of the complete etch process (photoresist trim plus polysilicon etch steps) for dense patterns from wafer to wafer. Uniformity improves with Open Area, due to the compensating uniformity patterns of the photoresist trim and polysilicon etch steps. The uniformity of both of these process steps degrades with an increase in open area (see, e.g., FIGS. 13a–b).

Figure 16A:
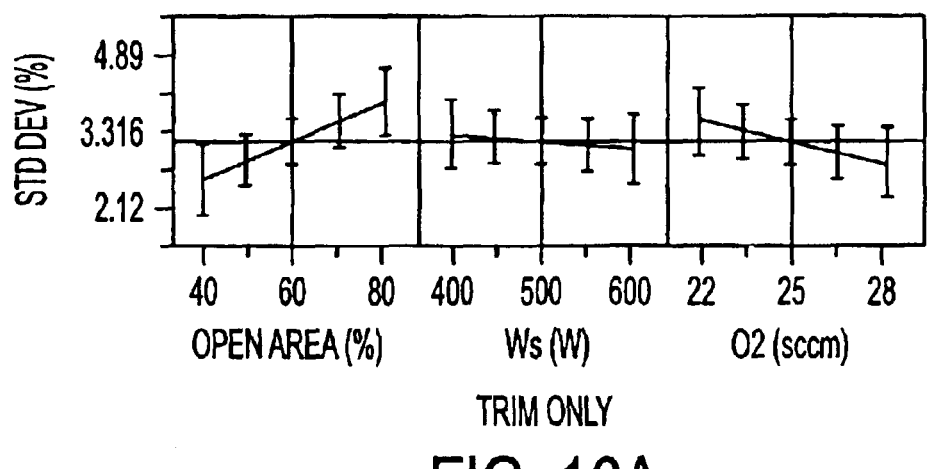
Figure 16B:
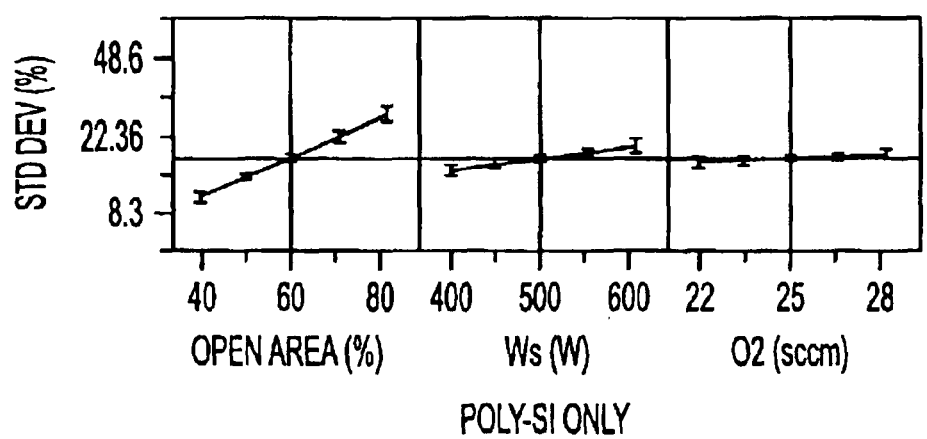
Figure 16C:
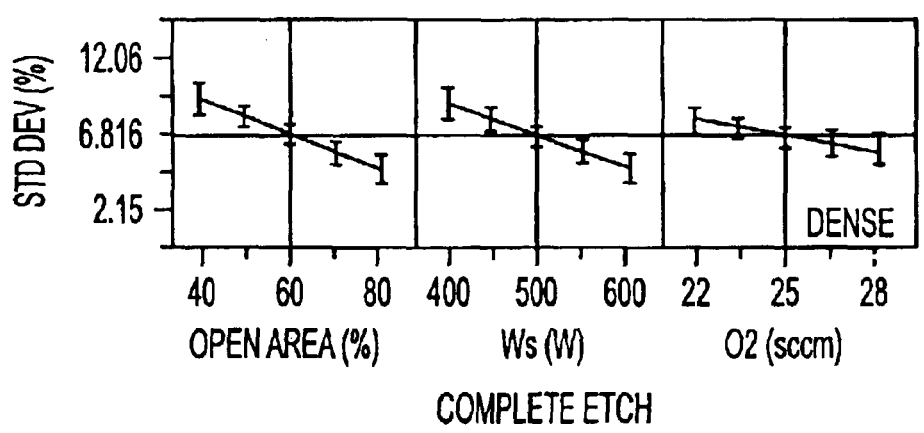

FIGS. 16a–c compare etch uniformity for the photoresist trim step, polysilicon etch step, and complete etch (trim and etch steps together), respectively. It can be seen in FIGS. 16a and 16b that the uniformity pattern between the trim and polysilicon etch steps compliment each other. As a result, the complete etch uniformity is better than each individual step (see FIG. 16c).

Referring again to FIG. 10, at step 10200 photoresist layer 950 is etched using the trim recipe determined by processor 320 using the experimentally determined equations. The result is shown at the right side of FIG. 9, wherein patterns PD and PI are trimmed to dimension $CD_{1D}$ and $CD_{11}$, respectively. Underlying layer 910 is then etched using photoresist patterns PD and PI as a mask, typically at the same etch chamber, in step 10300, resulting in structures S being formed (see bottom right of FIG. 9). Wafer W is thereafter optionally brought to a photoresist ash strip chamber (see step 10400), and brought back to measuring tool 310 at step 10500. The CD and profile of structure S are measured at several locations on wafer W, such as the locations where the pre-etch measurements of photoresist layer 950 were taken at step 10000.

Post-etch CD and profile information is supplied to processor 320, where deviations from target results can be used to adjust the trim and/or etch recipe for the next wafer to be etched. For example, from the measured CD and profile and the previously developed DOE modelling, etcher process drift can be determined; that is, etcher process "age" or where the etcher is on its process timeline. The etch recipe can then be adjusted for the next wafer, so the etch results are closer to the target. Post-etch information can also be fed back to processor 320 to discover and correct for problems in previous processes; for example, if the photoresist on a batch of wafers was baked at the wrong temperature, its trim rate will be different. Thus, if the first etched wafer is measured and this mistake is discovered, the trim time can be adjusted by processor 320 for the rest of the wafers to compensate. Moreover, if the measured dimensional variation is outside predetermined boundaries, or if the processing results change dramatically from one wafer to the next, an alarm can be generated to indicate the etcher should be taken out of service; e.g., for repairs or maintenance.

The embodiments of the present invention described immediately above, which enable realtime CD microloading control by feeding forward measurements relating to the CD and profile of both isolated and dense patterns, can also be implemented using the apparatus described hereinabove with reference to FIGS. 6A–E, which enable etch processing in a clean environment. Such processing can take place according to the flow chart of FIG. 7, as also discussed above, except that at measuring steps 1030 and 1110, the CDs of both isolated and dense patterns are measured, as well as their profiles, if desired. Of course, at recipe selection step 1040, the photoresist trim and etch recipes are selected based on the measurements of both isolated and dense patterns, as well as on other factors deemed relevant, as discussed in detail above.

The present invention is applicable to the manufacture of various types of semiconductor devices, particularly high density semiconductor devices having a design rule of about 0.18 $\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only a few examples of the versatility of the present invention are shown and described in the present disclosure. It is to be understood that the present invention is capable of use in various other combinations and environments and is capable of changes or modifications within the scope of the inventive concept as expressed herein.

What is claimed is:

1. A method of processing a semiconductor wafer, comprising:
    (a) measuring a CD of an isolated pattern of a patterned layer formed on an underlying layer on the wafer;
    (b) measuring a CD of a dense pattern that is one of a plurality of patterns of the patterned layer disposed proximal to each other;
    (c) selecting a first set of process parameter values for a first process to be performed on the wafer, based on the measurements of the isolated pattern CD and the dense pattern CD; and
    (d) performing the first process on the wafer at a processing tool using the first set of process parameter values.

2. The method of claim 1, comprising optically measuring the CDs of the isolated and dense patterns.

3. The method of claim 1, wherein the first process is an etch process for forming a structure in the underlying layer.

4. The method of claim 3, comprising measuring a CD of the structure formed in the underlying layer by the first process, and selecting a second set of process parameter values for a subsequently processed wafer using the CD measurement of the structure.

5. The method of claim 1, comprising forming the patterned layer by photolithographically forming a photoresist mask having isolated and dense photoresist patterns, wherein the measuring steps comprise measuring CDs of the isolated and dense photoresist patterns.

6. The method of claim 5, wherein the first process is a photoresist trim process, and the first set of process parameter values includes a trim time.

7. The method of claim 6, comprising selecting the trim time based on the measured CDs of the isolated and dense photoresist patterns and further based on a desired post-trim microloading, wherein the microloading is a difference between a trimmed isolated photoresist pattern CD and a trimmed dense photoresist pattern CD.

8. The method of claim 7, comprising developing a mathematical expression wherein the trim time is a function of the isolated photoresist pattern CD; the dense photoresist pattern CD; a difference between the isolated photoresist pattern CD and a desired post-trim isolated photoresist pattern CD; and a difference between the dense photoresist pattern CD and a desired post-trim dense photoresist pattern CD.

9. The method of claim 7, further comprising performing an etch process of the underlying layer using the trimmed photoresist patterns as a mask.

10. The method of claim 9, comprising performing the trim process and the etch process on the wafer at the processing tool.

11. The method of claim 9, comprising cleaning the wafer after performing the etch process.

12. The method of claim 9, comprising measuring a CD of a structure formed in the underlying layer by the etch process, and selecting a second set of process parameter values for a subsequently processed wafer using the CD measurement of the structure.

13. The method of claim 9, comprising choosing an etch recipe for the underlying layer etch process based on the measured CDs of the isolated and dense photoresist patterns.

14. The method of claim 9, comprising etching the underlying layer using a set of etch parameters to form an isolated pattern in the underlying layer corresponding to the isolated photoresist pattern and having a post-etch isolated pattern CD, and a dense pattern in the underlying layer corresponding to the dense photoresist pattern and having a post-etch dense pattern CD;
wherein the etch parameters are selected based on a desired post-etch microloading, wherein the microloading is a difference between the post-etch isolated pattern CD and the post-etch dense pattern CD.

15. The method of claim 14, comprising determining a percentage of open area of the photoresist mask wherein no photoresist patterns are located, and selecting the etch parameters further based on the open area percentage to achieve the desired post-etch microloading.

16. The method of claim 7, wherein the photoresist mask comprises a plurality of the isolated and dense photoresist patterns, the method comprising:
measuring the CD of the plurality of the isolated and dense photoresist patterns;
averaging the CD measurements; and
using the average CD measurements to select the trim time.

17. The method of claim 7, comprising measuring a sidewall profile of the isolated photoresist pattern and a sidewall profile of the dense photoresist pattern, and selecting the trim time further based on the measured sidewall profiles.

18. The method of claim 7, comprising determining a thickness of the photoresist mask, and selecting the trim time further based on the photoresist mask, thickness.

19. The method of claim 18, comprising determining a thickness of the underlying layer, and selecting the trim time further based on the underlying layer thickness.

20. The method of claim 7, comprising determining a percentage of open area of the photoresist mask wherein no photoresist patterns are located, and selecting the trim time further based on the open area percentage.

21. The method of claim 7, wherein the first set of process parameter values includes a source power, comprising selecting the source power based on the desired post-trim microloading.

22. The method of claim 1, wherein the isolated and dense patterns comprise lines, each having a line width;
wherein the isolated pattern is spaced at least about 5 line widths from the closest pattern on the patterned layer; and
wherein the dense pattern is spaced from about 1 to about 3 line widths from the closest pattern on the patterned layer.

23. The method of claim 1, comprising measuring the CDs of the isolated and dense patterns using a CDSEM.

24. The method of claim 1, comprising measuring the CDs of the isolated and dense patterns using an AFM.

25. An apparatus for processing a semiconductor wafer, comprising:
a measuring tool for measuring a CD of an isolated pattern on a patterned layer formed on an underlying layer on the wafer, and for measuring a CD of a dense pattern that is one of a plurality of patterns of the patterned layer disposed proximal to each other;
a processing tool for performing a process on the wafer using a first set of process parameter values; and
a processor configured to select the first set of process parameter values based on the measurements of the isolated pattern CD and the dense pattern CD.

26. The apparatus of claim 25, wherein the measuring tool comprises an optical measuring tool.

27. The apparatus of claim 26, wherein the optical measuring tool is for employing scatterometry or reflectometry.

28. The apparatus of claim 25, wherein the processing tool is an etcher.

29. The apparatus of claim 28, wherein the patterned layer is a photoresist mask having isolated and dense photoresist patterns, and the measuring tool is for measuring CDs of the isolated and dense photoresist patterns.

30. The apparatus of claim 29, wherein the etcher is for performing a photoresist trim process on the photoresist mask, and one of the first set of process parameters selected by the processor is a photoresist trim time.

31. The apparatus of claim 30, wherein the processor is configured to select the trim time based on the measured CDs of the isolated and dense photoresist patterns and further based on a desired post-trim microloading, wherein the microloading is a difference between a trimmed isolated photoresist pattern CD and trimmed dense photoresist pattern CD.

32. The apparatus of claim 31, wherein the processor is configured to select the trim time using a mathematical expression wherein the trim time is a function of the isolated photoresist pattern CD; the dense photoresist pattern CD; a difference between the isolated photoresist pattern CD and a desired post-trim isolated photoresist pattern CD; and a difference between the dense photoresist pattern CD and a desired post-trim dense photoresist pattern CD.

33. The apparatus of claim 31, wherein the etcher is for performing an etch process on the underlying layer using the trimmed photoresist patterns as a mask.

34. The apparatus of claim 33, further comprising a stripping tool for removing residue from the wafer after etching the underlying layer.

35. The apparatus of claim 33, wherein the measuring tool is for measuring a CD of a structure formed in the underlying layer by the etch process, and the processor is configured to select a second set of process parameter values for a subsequently processed wafer using the CD measurement of the structure.

36. The apparatus of claim 33, wherein the processor is configured to choose an etch recipe for the underlying layer etch process based on the measured CDs of the isolated and dense photoresist patterns.

37. The apparatus of claim 33, wherein the etcher is for etching the underlying layer using a set of etch parameters to form an isolated pattern in the underlying layer corresponding to one of the isolated photoresist patterns and having a post-etch isolated pattern CD, and a dense pattern in the underlying layer corresponding to one of the dense photoresist patterns and having a post-etch dense pattern CD;
wherein the processor is further configured to select the etch parameters based on a desired post-etch microloading, wherein the microloading is a difference between the post-etch isolated pattern CD and the post-etch dense pattern CD.

38. The apparatus of claim 37, wherein the processor is further configured to determine a percentage of open area of the photoresist mask wherein no photoresist patterns are located, and select the etch parameters further based on the open area percentage to achieve the desired post-etch microloading.

39. The apparatus of claim 31, wherein the photoresist mask comprises a plurality of the isolated and dense photoresist patterns, wherein the measuring tool is for measuring the CD of the plurality of the isolated and dense photoresist patterns, and the processor is configured to:
average the CD and profile measurements; and
use the average CD and profile measurements to select the trim time.

40. The apparatus of claim 31, wherein the measuring tool is for measuring a sidewall profile of one of the isolated photoresist patterns and a sidewsall profile of one of the dense photoresist patterns, and the processor is configured to select the trim time further based on the measured sidewall profiles.

41. The apparatus of claim 31, wherein the measuring tool is for determining a thickness of the photoresist mask, and the processor is configured to select the trim time further based on the photoresist layer thickness.

42. The apparatus of claim 31, wherein the mesasuring tool is for determining a thickness of the underlying layer, and the processor is configured to select the trim time further based on the underlying layer thickness.

43. The apparatus of claim 31, wherein the processor is further configured to determine a percentage of open area of the photoresist mask wherein no photoresist patterns are located, and select the trim time further based on the open area percentage.

44. The apparatus of claim 31, wherein the first set of process parameter values includes a source power, and the processor is further configured to select the source power based on the desired post-trim microloading.

45. The apparatus of claim 28, wherein the etcher is for performing the process to form a structure in the underlying layer, wherein the measuring tool is for measuring a CD of the structure formed in the underlying layer, and the processor is configured to select a second set of process parameter values for a subsequently processed wafer using the CD measurement of the structure.

46. The apparatus of claim 25, wherein the measuring tool comprises a CDSEM.

47. The apparatus of claim 25, wherein the measuring tool comprises an AFM.

48. An apparatus for processing a semiconductor wafer, comprising:
a measuring tool for measuring a CD of an isolated pattern on a patterned layer formed on an underlying layer on the wafer, and for measuring a CD of a dense pattern that is one of a plurality of patterns of the patterned layer disposed proximal to each other;
a first processing tool for performing a process on the wafer using a first set of process parameter values;
a processor configured to select the first set of process parameter values based on the measurements of the isolated pattern CD and the dense pattern CD;
a transfer mechanism for transferring the wafer between the measuring tool and the processing tool; and
a chamber for enclosing the transfer mechanism and allowing communication between the transfer mechanism, the measuring tool and the processing tool in a clean environment.

49. The apparatus of claim 48, wherein the measuring tool is an optical measurement tool.

50. The apparatus of claim 49, wherein the measurement tool employs scatterometry or reflectometry.

51. The apparatus of claim 48, wherein the chamber comprises:
a mainframe for mounting a plurality of processing tools, including the first processing tool;
a factory interface for mounting a wafer cassette; and
a transfer chamber between and in communication with the mainframe and the factory interface;
wherein the transfer mechanism comprises a first robot for transferring the wafer between the measuring tool, the transfer chamber and the wafer cassette, and a second robot for transferring the wafer between the transfer chamber and the processing tool;
wherein the measuring tool is mounted on the factory interface or the mainframe.

52. The apparatus of claim 51, wherein the first processing tool comprises an etcher, the process is a photoresist trim process, the first process parameter values comprise a photoresist trim recipe, and the processor is configured to control the etcher to perform an etch process on the wafer after the photoresist trim process is performed on the wafer.

53. The apparatus of claim 52, wherein the processor is configured to:
control the transfer mechanism to transfer the wafer from the etcher to the measuring tool after the etch process is performed on the wafer; and
control the measuring tool to measure the CD of a structure formed in the underlying layer during the etch process.

54. The apparatus of claim 52, further comprising an ashing strip processing unit mounted to the mainframe or the factory interface for removing residue from the wafer, wherein the processor is configured to control the transfer mechanism to transfer the wafer to the ashing strip processing unit after the etch process is performed on the wafer.

55. The apparatus of claim 54, further comprising a cleaning chamber mounted to the factory interface for cleaning the wafer, wherein the processor is configured to control the transfer mechanism to transfer the wafer to the cleaning chamber after an ashing strip process is performed on the wafer at the ashing strip processing unit.

56. The apparatus of claim 48, wherein the first processing tool comprises an etcher.

57. The apparatus of claim 56, wherein the processor is configured to:
control the transfer mechanism to transfer the wafer from the etcher to the measuring tool after the process is performed on the wafer; and control the measuring tool to measure the CD of a structure formed in the underlying layer at the etcher.

58. The apparatus of claim 48, wherein the measuring tool comprises a CDSEM.

59. The apparatus of claim 48, wherein the measuring tool comprises an AFM.

* * * * *